US005784286A

United States Patent [19]

Hirose et al.

[11] Patent Number: 5,784,286
[45] Date of Patent: Jul. 21, 1998

[54] DESIGN PROCESS RECORDING METHOD AND A DESIGN PROCESS RECORDER

[75] Inventors: Atsushi Hirose, Sanda, Japan; David M. Cannon; Larry J. Leifer, both of Stanford, Calif.

[73] Assignee: Matsushita Electric Industrial Co., Ltd., Kadoma, Japan

[21] Appl. No.: 749,068

[22] Filed: Nov. 14, 1996

Related U.S. Application Data

[63] Continuation of Ser. No. 393,497, Mar. 2, 1995, abandoned.
[51] Int. Cl.$^6$ .................................................. G06F 15/00
[52] U.S. Cl. .................. 364/488; 395/500; 395/683; 395/702; 707/192; 707/1
[58] Field of Search ................... 395/500, 601, 395/702, 615, 456, 480, 683, 703, 710; 364/488, 468, 474.22, 474.24, 468.03, 578, 468.15; 707/1, 102

[56] References Cited

U.S. PATENT DOCUMENTS

| 4,817,036 | 3/1989 | Millett et al. ........................ | 395/601 |
|---|---|---|---|
| 4,964,060 | 10/1990 | Hartsog ............................... | 364/512 |
| 5,050,091 | 9/1991 | Rubin .................................. | 364/488 |
| 5,265,244 | 11/1993 | Ghosh et al. ......................... | 395/601 |
| 5,392,220 | 2/1995 | van den Hamer et al. ........... | 364/488 |
| 5,414,809 | 5/1995 | Hogan et al. ........................ | 395/155 |
| 5,430,873 | 7/1995 | Abe et al. ............................ | 395/702 |
| 5,432,932 | 7/1995 | Chen et al. ...................... | 364/DIG. 1 |
| 5,448,496 | 9/1995 | Butts et al. .......................... | 364/489 |
| 5,539,652 | 7/1996 | Tegethoff ............................. | 364/488 |
| 5,564,046 | 10/1996 | Nemoto et al. ...................... | 395/613 |
| 5,606,700 | 2/1997 | Anthias et al. ...................... | 395/500 |

FOREIGN PATENT DOCUMENTS 4340167  11/1992  Japan.
4340168  11/1992  Japan.

OTHER PUBLICATIONS

Lakin et al, AAAI '92 Workshop on Design Rationale Capture and Use, "Mapping Design Information", Jun. 1992, pp. 171–177.
Gruber et al, Proceeding of the 8th Intl. Workshop, 1991, "Design Rationale Capture as Knowledge Acquisition ...", pp. 1–10, Jan. 1991.
Nagy et al, Design Theory and Methodology ASME 1991, De-vol. 31, "A Knowledge Base Date Representation for ...," pp. 69–76, Jan. 1991.
Chen et al, Design Theory and Methodology–DTM'90, Design History Knowledge Representation and its Basic Computer Implementation, pp. 175–184, Jan. 1990.
Klein et al, IEEE Computers, Jan. 1993, "Capturing Design Rational in Concurrent Engineering Teams", pp. 39–47.
Nielsen et al, Design Theory and Methodology ASME 1991, DE–VOL. 31 "Capturing and Using Designer Intent in a Design ...", pp. 95–102, Jan. 1991.
Baudin et al, IJCAI–93, Using Device Models to Facilitate the Retrieval of Multimedia Design Information, pp. 1237–1243. No Date.
Lakin et al, The Virtual Computer 1989, "The Electronic Design Notebook: Performing Medium and Processing Medium", pp. 214–226, Jan. 1989.
Puttre, Mechanical Engineering, vol. 114, No. 1, Jan. 1992, "Document Management: Establishing an Electronic Archive," pp. 74–78.

(List continued on next page.)

*Primary Examiner*—Jacques H. Louis-Jacques
*Attorney, Agent, or Firm*—Renner, Otto, Boisselle & Sklar, P.L.L.

[57] ABSTRACT

The design process recorder of the invention includes a data collector for inputting a query; a data storage and management unit for storing a design record including a plurality of nodes and a plurality of arcs, one of the plurality of nodes corresponding to design information; and a story teller for tracing back and forth the nodes and the arcs from a node indicated by the query, and for presenting design information related to a traced node as a story-board.

8 Claims, 20 Drawing Sheets

OTHER PUBLICATIONS

Arnold et al "Do design records really benefit software maintenance?" 1993 IEEE.

Abbattista et al "An experiment on the Effect of design recordng on Impact Analysis." 1994 IEEE.

Baudin et al "Recovering rationale for design changes: A knowledge–based approach" 1990 IEEE.

Lees et al "A graphical programming language for Robots operating in lightly structured environments" 1993 IEEE.

Toye et al "SHARE: A methodology and environment for collaborative product development." 1993 IEEE.

Leifer et al "Visual Language Programming: for robot command control in unstructured environments" 1991 IEEE.

Hong et al "Personal electronic notebook with sharing" 1995 IEEE.

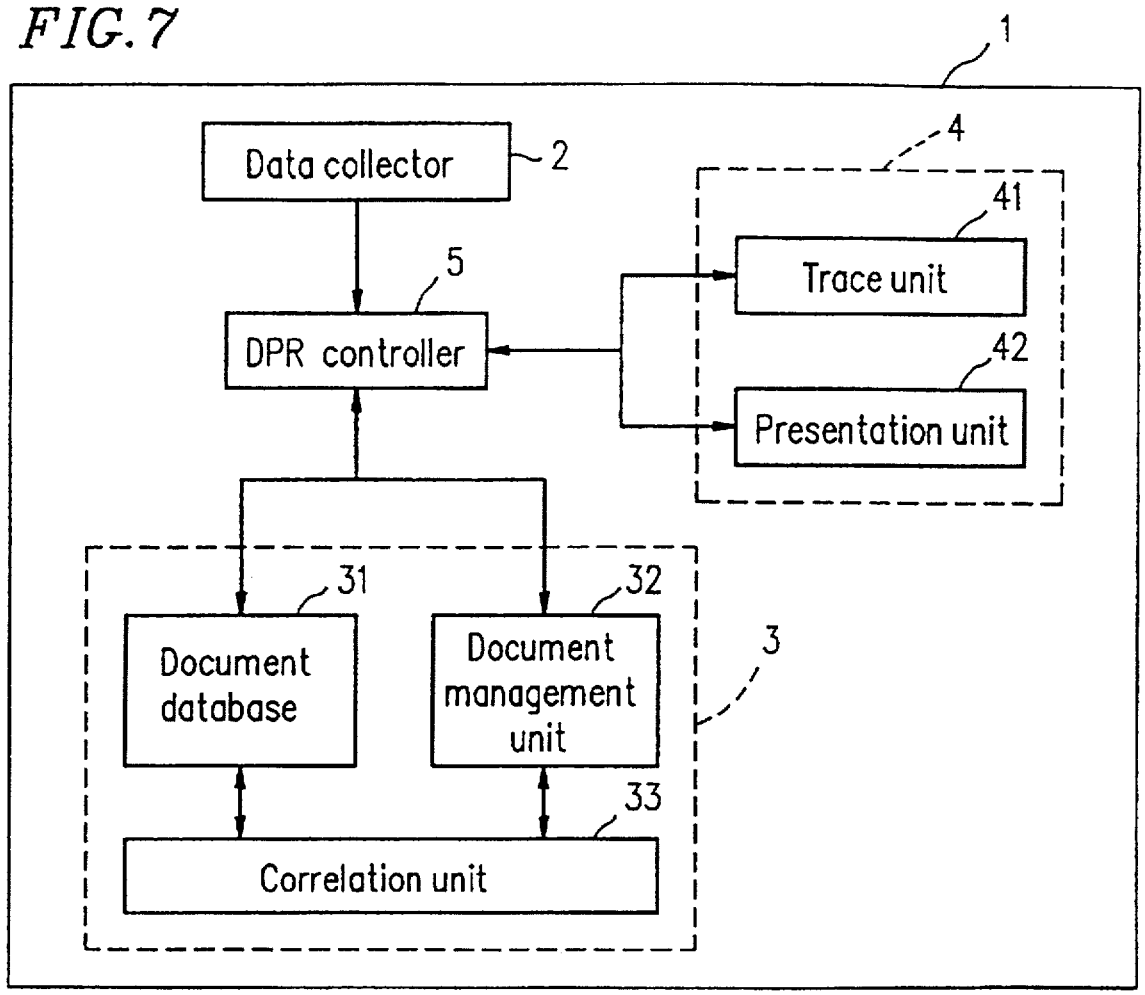

FIG. 13
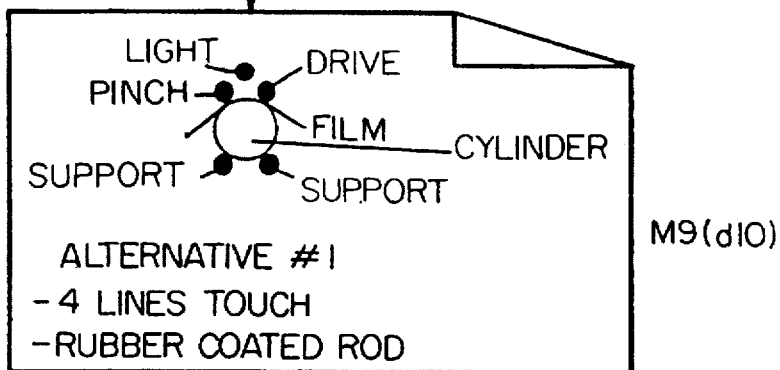
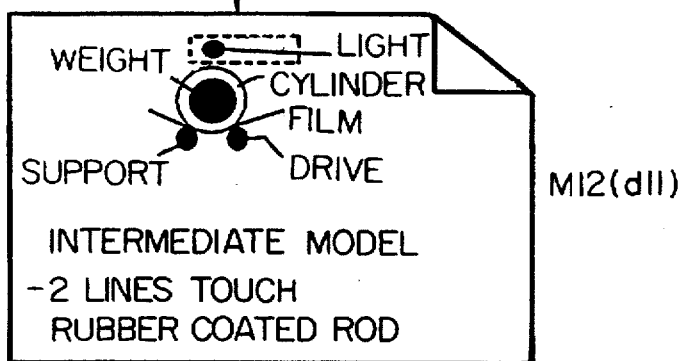
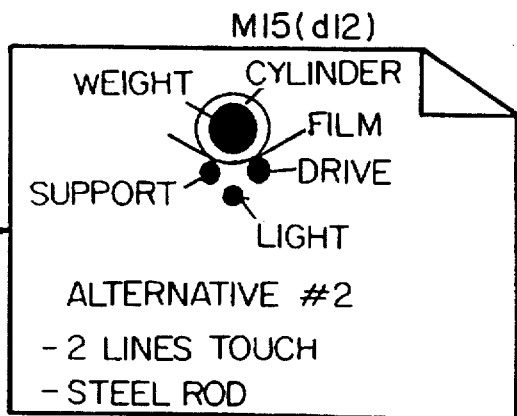

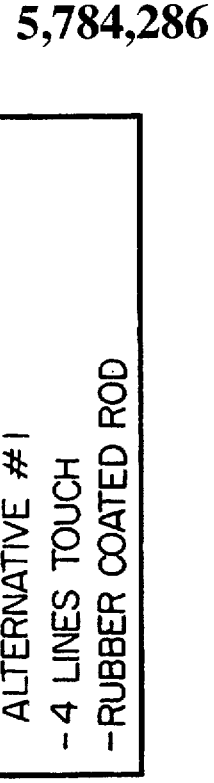
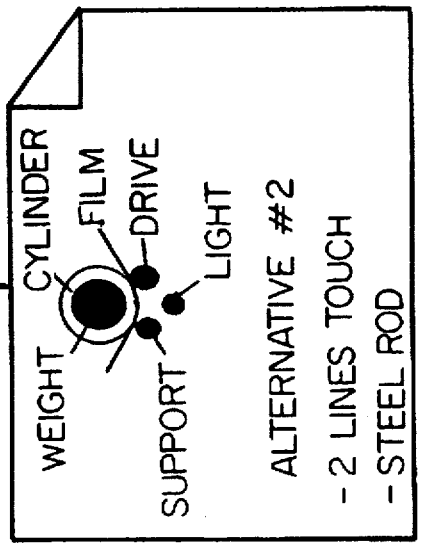
FIG. 16

DESIGN PROCESS RECORDING METHOD AND A DESIGN PROCESS RECORDER

This is a continuation of application Ser. No. 08/393,497 filed on Mar. 2, 1995, now abandoned.

BACKGROUND OF THE INVENTION

1. Field of the Invention

The present invention relates to a design process recording method and a design process recorder.

2. Description of the Related Art

Corporate design practice has changed dramatically in the last 20–25 years due to computer support for technical drawing (CAD); highly structured modeling and analysis; and planning, finance and other management activities. Progress in these areas helps us do these tasks faster and more precisely, but has provided little or no support for recording the process by which artifacts are designed. It is being increasingly recognized that a clear account of a design's evolution, consisting of such information as avenues that were explored and discarded, the reasons for particular features of a design, and accounts of how the goals of the design may have been refined or changed over time, can be as important a product of design activity as the artifact or design itself.

Well-written design reports can to some extent serve to document design processes. But in practice such reports are most often an afterthought, and often impose a post-facto, misleading rationalization on the progress; they leave out dead-ends and mistakes that may be crucial to understanding the end product, and they are almost universally regarded as a burden by the designers themselves.

Many of the benefits of a more accessible and meaningful record of engineering design processes have been suggested. For example, the benefits include: the opportunity to avoid repeated work; better coordination of goals among designers; automatic propagation of the effects of changing goals and external factors; reduced effort and improved effectiveness in artifact diagnosis, maintenance, and redesign; and a permanent record of the design that can support better education.

However, there has been no design method and tools capable of treating a more accessible and meaningful record of the engineering design processes, although many approaches to recording the design process have been made in order to obtain such benefits.

Two key distinguishing attributes characterize all such approaches: roughly, the level of formality of the data that each records, and cost of acquisition of this data. See, Lakin et al., "Mapping Design Information", AAAI '92 Workshop on Design Rationale Capture and Use, pp. 171–177, June 1992; and Gruber et al., "Design Rationale Capture as Knowledge Acquisition: Tradeoffs in the. Design of Interactive Tools", Machine Learning: Proceedings of the Eighth Annual International Workshop, pp. 1–10, 1991. These two attributes are generally traded off against one another; it has become clear that capturing (or, in fact, creating) more formal, structured information is an expensive proposition. Formal records are designed to take advantage of a computer's ability to process a large amount of concise information, and are shaped by a strong (i.e. algorithmic or formal) model of the artifact, or a strong model of the cognitive processes that constitute a history or explanation of an idea, or both. That is, information in a design process record must have some unifying structure, and this structure reflects a point of view about the process. Formal design records have taken such forms as:

representations of an idealized argumentation and decision process (see, for example, Nagy et al., "A Knowledge Base Data Representation for Collaborative Mechanical Design", Proceedings of Design Theory and Methodology ASME 1991, DE-Vol.31, pp. 69–76, 1991);

representations of constraints on the artifact which grow from those decisions and are applied, rescinded, and reconciled in a state-space-search-like process (see, for example, Chen et al., "Design History Knowledge Representation and its Basic Computer Implementation", Proceedings of Design Theory and Methodology ASME 1990, pp. 175–184, 1990; and Klein, "Capturing Design Rationale in Concurrent Engineering Teams", IEEE Computer, pp. 39–47, January 1993);

representations of features which both describe the designed artifact and are associated with the designers' intent (see, for example, Nielsen et al., "Capturing and Using Designer Intent in a Design-With-Features System", Proceedings of Design Theory and Methodology ASME 1991, DE-Vol.31, pp. 95–102, 1991).

Each formal recording approach offers advantages that can clearly be of great value to a particular reuse scenario, depending on such factors as the up-front costs that can be tolerated and the particular life-cycle needs of the design effort.

However, according to such conventional formal recording approaches, it is not easy for designers to record design processes because of the high level of the formality of the data, thereby making the cost of acquisition of the data high.

As conventional informal recording approaches, the indexing and retrieval tool "Dedal" and the "Electronic Design Notebook" are known. The "Dedal" is described in Baudin et al., "Using Device Models to Facilitate the Retrieval of Multimedia Design Information", Proceedings, 13th International Joint Conference on Artificial Intelligence, pp. 1237–1243, 1993. The "Electronic Design Notebook" is described in Lakin et al., "The electronic Design Notebook: Performing Medium and Processing Medium", Visual Computer: International Journal of Computer Graphics, pp. 214–226, 1989.

However, these conventional informal recording approaches tend to treat the design record as unstructured information, and accordingly it is not easy to play back the design process in response to a query.

A conventional document management system is described in "Document Management: Establishing an Electronic Archive", Mechanical Engineering, Vol. 114, No. 1, pp. 74–78, January 1992. The conventional document management system manages document data by the use of keyword and directories. In a retrieval, the keyword and the directories are used as a retrieval key.

However, it is difficult to determine the choice of keyword for respective documents in view of the effectiveness of a retrieval of the documents, because the cost of recording design process using keyword and directories is expensive. The keyword is too flexible for recording design process, while directories are too solid for recording design process.

SUMMARY OF THE INVENTION

The present invention provides a design process recording method and a design process recorder which implements the design process recording method. Our approach is different from above-mentioned conventional approaches in that, while there is some formal structure in the records, the applicants choose to sacrifice where necessary formality in exchange for ease of recording. We assert that a key to ease of recording is to be guided by a process model centered on, and shaped by, the point of view of the acting designer, a model which does not necessarily fit a unified, algorithmic framework.

In accordance with one aspect of the invention, the design process recorder includes: a data collector for inputting a query; a data storage and management unit for storing a design record including a plurality of nodes and a plurality of arcs, one of the plurality of nodes corresponding to design information; and a story teller for tracing back and forth the nodes and the arcs from a node indicated by the query, and for presenting design information related to a traced node as a storyboard.

Alternatively, the design process recorder includes: an input unit for inputting a query; a first storage area for storing design information; a second storage area for storing management information including a plurality of nodes, a plurality of arcs each connecting a pair of the nodes and a plurality of subgraphnodes each grouping the nodes and the arcs, one of the plurality of subgraphnodes being connectable with a node grouped in another of the plurality of subgraphnodes through an arc; a correlation unit for correlating one of the plurality of nodes stored in the second storage area to at least a portion of the design information stored in the first storage area; a trace unit for tracing back and forth the nodes and the arcs from a node indicated by the query; and a presentation unit for presenting design information related to nodes traced by the trace unit in a predetermined order.

In one embodiment of the invention, the trace units selectively traces back and forth the nodes and the arcs in accordance with a predetermined rule.

In another embodiment of the invention, each of the nodes and the arcs includes attribute information, and the presentation unit presents attribute information related to the nodes and the arcs traced by the trace unit, as well as the design information related to the nodes traced by the trace unit.

In another embodiment of the invention, the design process recorder further includes: an edit unit for editing the management information interactively.

In accordance with another aspect of the invention, the design process recording method includes the steps of: a) inputting a query; b) storing a design record including a plurality of nodes and a plurality of arcs, one of the plurality of nodes corresponding to design information; c) tracing back and forth the nodes and the arcs from a node indicated by the query; and d) presenting design information related to a traced node as a story-board.

Alternatively, a design process recording method includes the steps of: a) inputting a query; b) storing design information; c) storing management information including a plurality of nodes, a plurality of arcs each connecting a pair of the nodes and a plurality of subgraphnodes each grouping the nodes and the arcs, one of the plurality of subgraphnodes being connectable with a node grouped in another of the plurality of subgraphnodes through an arc; d) correlating one of the plurality of nodes to at least a portion of the design information; e) tracing back and forth the nodes and the arcs from a node indicated by the query; and f) presenting design information related to nodes traced in step e) in a predetermined order.

In one embodiment of the invention, step e) includes a step of selectively tracing back and forth the nodes and the arcs in accordance with a predetermined rule.

In another embodiment of the invention, each of the nodes and the arcs includes attribute information, and step f) includes a step of presenting attribute information related to the nodes and arcs traced in step e), as well as the design information related to the nodes traced in step e).

In another embodiment of the invention, the design process recording method further includes a step of editing the management information interactively.

Thus, the invention described herein makes possible the advantages of (1) providing a design process recording method and a design process recorder capable of being cost-effective for use during the original design process, in addition to being useful downstream, (2) providing a design process recording method and a design process recorder that designers and design groups find useful and is inexpensive in terms of time and money, so that the benefits of use for design and redesign over the short time merit the investment.

These and other advantages of the present invention will become apparent to those skilled in the art upon reading and understanding the following detailed description with reference to the accompanying figures.

BRIEF DESCRIPTION OF THE DRAWINGS

FIG. 7 is a block diagram showing a detailed configuration for a design process recorder for recording a design record according to the present invention.

FIGS. 11 to 18 are diagrams each showing an example of a storyboard presented by the presentation unit 42.

DESCRIPTION OF THE PREFERRED EMBODIMENTS

Hereinafter, a design process recording method and a design process recorder according to the present invention will be described. The design process recording method focuses on information generated in early stages of design that is at the same time easiest to capture and most useful to designers and engineers downstream. It does this by being based primarily on a design process model intended to reflect a designer's point of view, and by taking advantage of practices that designers currently find useful. The record consists of connected pieces of information about the various concepts, notes, and documents that are central to an evolving design. We call the framework for the record a hypergraph: 'graph' because of its node-arc structure, and 'hyper' because it spans several types of information that are created during design work. To effectively convey the record's contents to a downstream user, the applicants propose a design story-teller style: the system's response to a query takes the form of a storyboard of notes about related design episodes.

Figure 1:
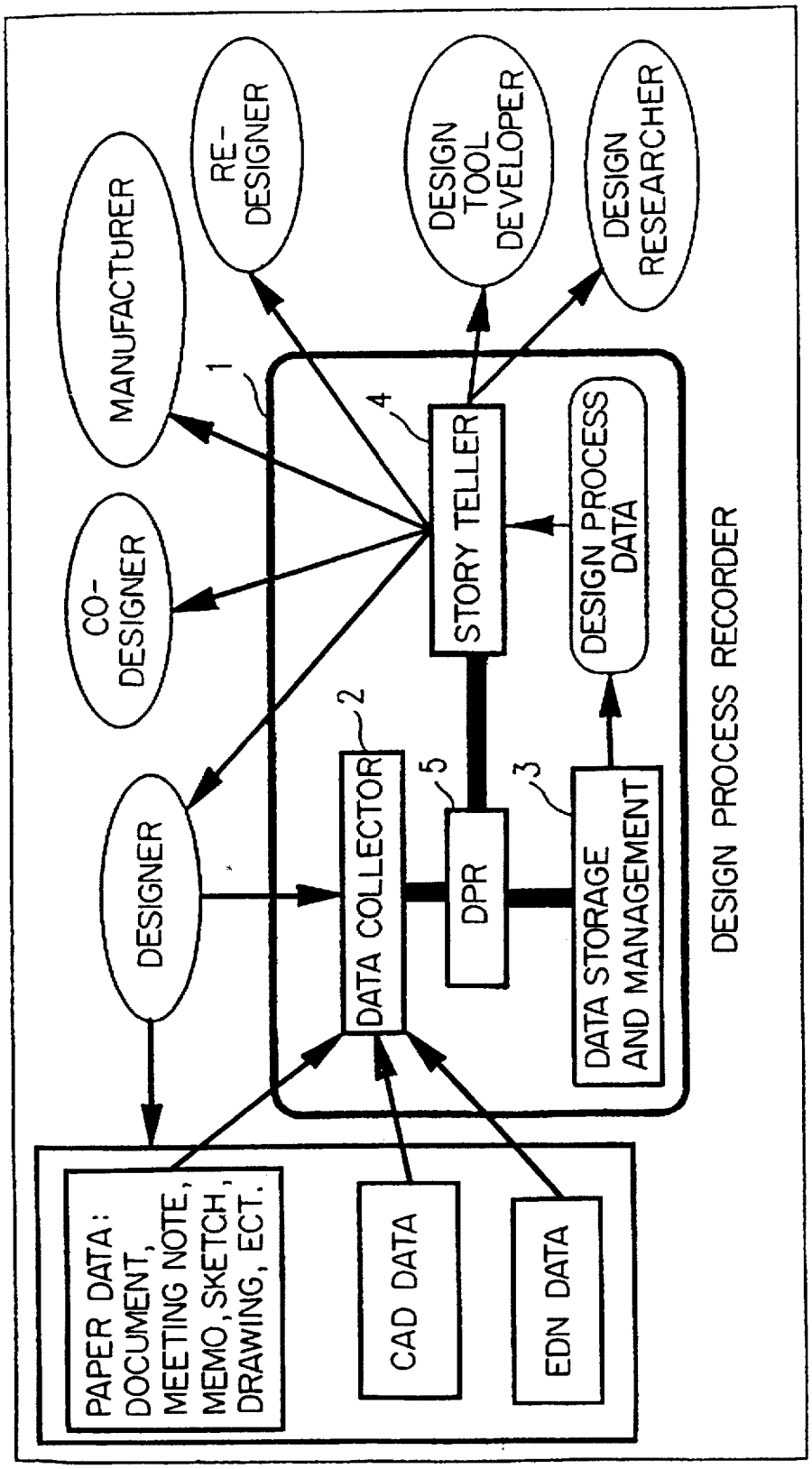
FIG. 1 is a block diagram showing a configuration for a design process recorder for recording a design record according to the present invention.

FIG. 1 schematically shows a configuration for a design process recorder 1 according to the present invention. The design process recorder (DPR) 1 includes a data collector 2, a data storage and management unit 3, a story teller 4 and a DPR controller 5. The DPR controller 5 controls the operations of the data collector 2, the data storage and management unit 3 and the story teller 4.

The Data Collector 2

Broadly, the data collector 2 provides the designer with a place to put design work, and a set of templates or containers where loosely-structured information can be entered and among which connections can be made. These templates and containers are referred to as 'components' of the record, and can be assembled by the designer to generate an evolving framework corresponding to parts of the process, and of working documents (i.e. the actual reports, CAD drawings, calculations, notes and sketches, references to paper documents, etc., in whatever format that is being produced by designers). Components are classified into two categories: 'basic' components and 'key' components. These will be explained below.

Basic Components

Figure 2:
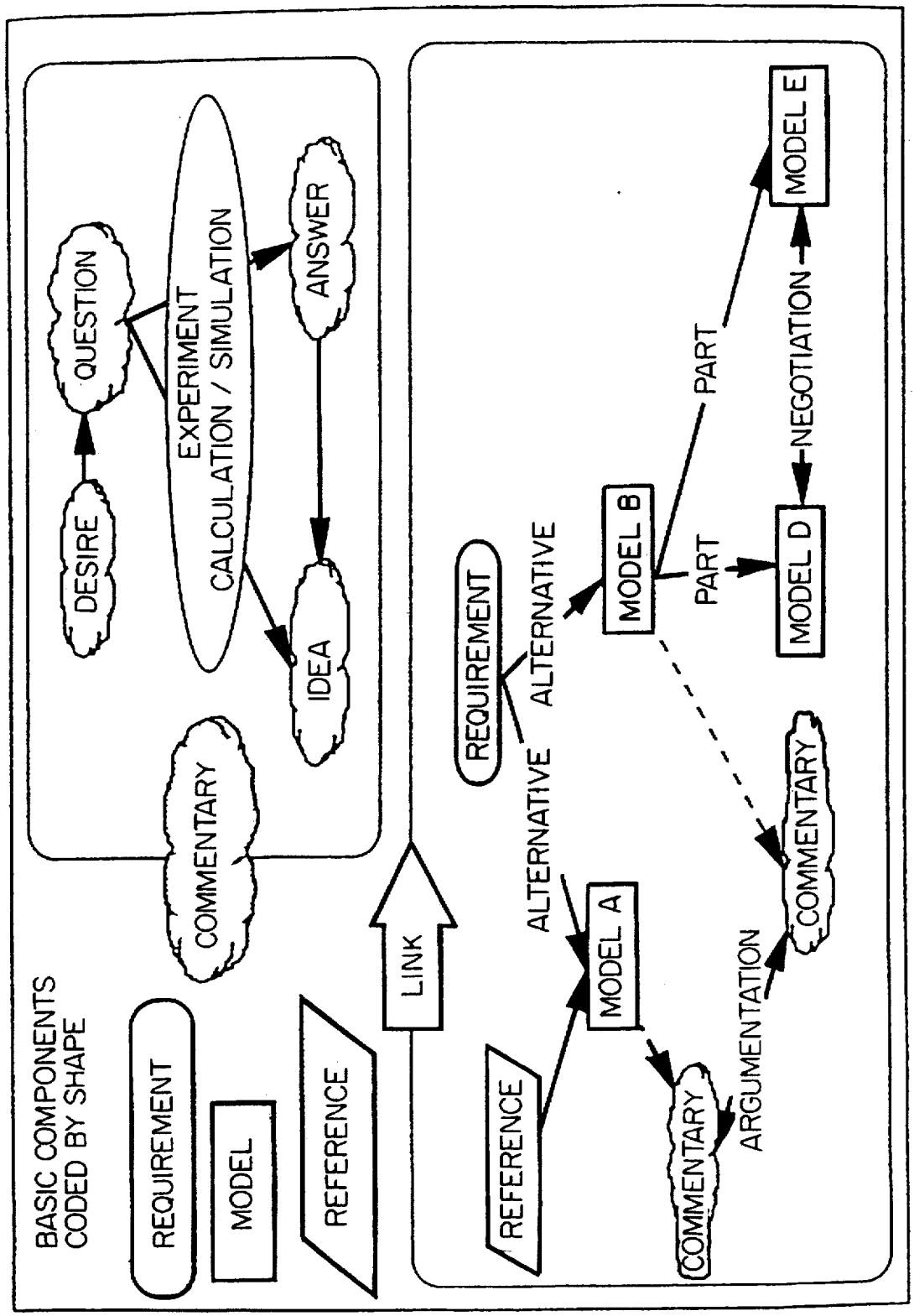
FIG. 2 is a diagram showing basic components of the design record.

FIG. 2 shows basic components of the design process recorder with example arrangements from a hypothetical process record. The basic components correspond to the fundamental elements of the record.

Requirements and models are two of the most fundamental elements of the design process, and are represented by <Requirement> and <Model> here, where the former can include generated constraints, and the latter can include a baseline approach, concept or an analytic model.

<Reference> is a place to put any supporting information drawn from outside the decision process, say the designer's experience or supporting experiments.

<Commentary> is a place to put information which guides or is drawn from the model evolution process; such things as questions, answers, new ideas, and the designer's observations, preferences and desires can be noted here.

A <Link> is used to make connections among instances of <Model> and <Requirement> components. The <Alternative Models Link> and the <Model Decomposition Link> are used to create a structure representing the design process.

These components are freely assembled by the designer as design proceeds; the outgrowth of this is a temporal record of the process, approximately but not strictly hierarchical.

Key Components

Figure 3:
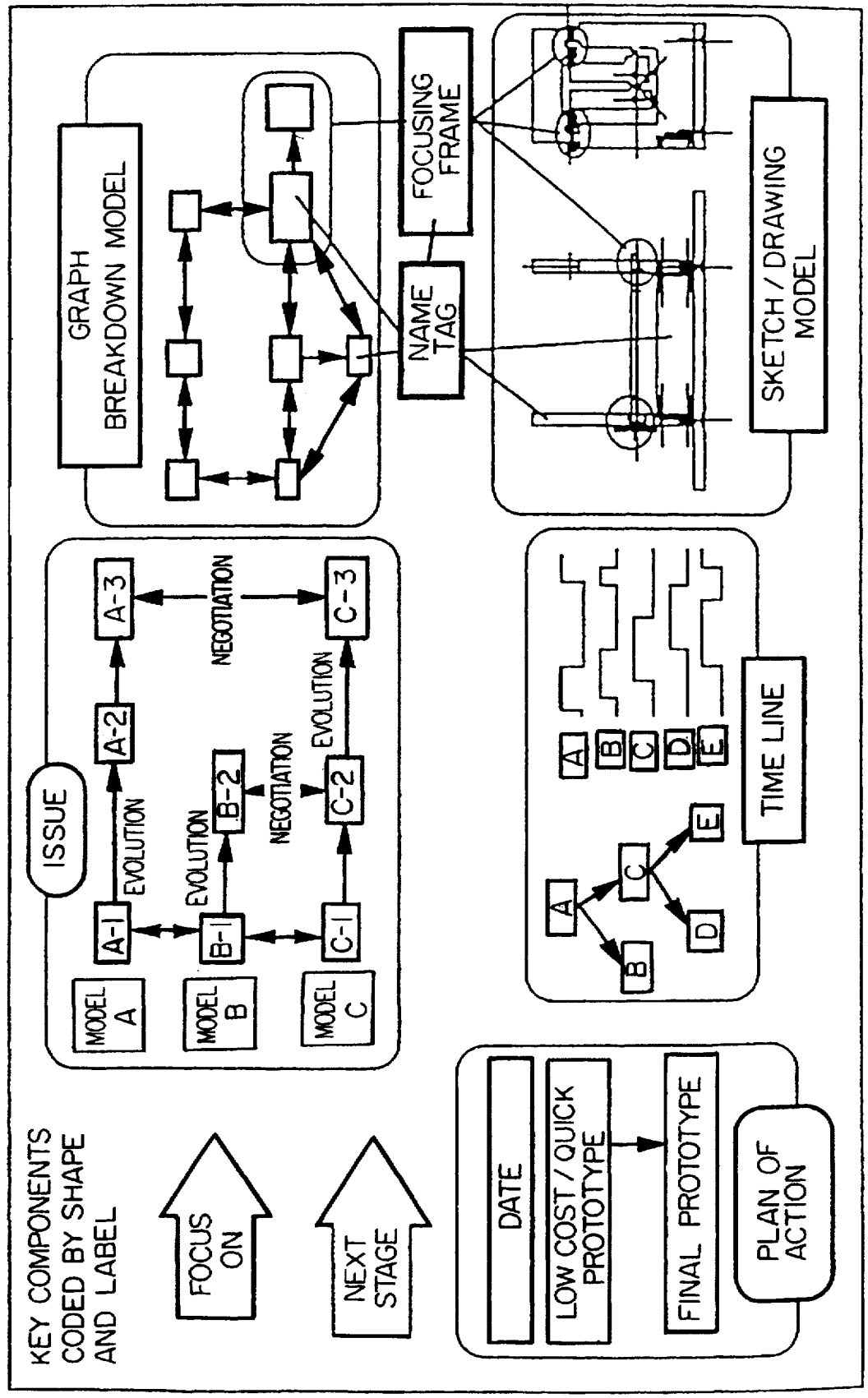
FIG. 3 is a diagram showing key components of the design record.

FIG. 3 shows key components of the design process recorder with example arrangements from a hypothetical process record. The key components are additional elements in the record, and show structure and connections between working documents and a design record. The reason why these elements have been created is because the applicants have found the corresponding concepts to be common in design work, valuable in conveying to another designer the particulars of the ongoing process, and not adequately captured by other design process models. These additional elements are tailored to portray the design process from the designer's point of view, rather than from the point of view of a strong cognitive or artifact model.

In a longer-term design process, we find that designers often give accounts of their work in terms of stages. <Next Stage> is used to link the record of one stage to the next. A formal process model might give precise definitions of what constitutes a stage; however, in the present invention, division into stages is done in a content-dependent way, and is not necessarily determined strictly by the structure of the record. The best structural principles are that a new stage is entered when a higher-level issue has been settled, and/or when the designers begin to use different media or amounts of detail to develop their design.

<Plan of Action> is used to record a fragment of design strategy that is being developed or modified during the process—for instance, the reason that the next stage of the design was started. The plan of action is generally not an overall plan for the project, but a description of what the next few items to work on will be, and sketchy plans are incrementally modified or fleshed out based on what is learned by following them.

<Focus On> is used to represent such an area of focus, and as a link to where a discussion of the relevant issues can be recorded.

<Issue> is a place to put the content of the discussion noted above; it is not entirely different in name and concept from the issue components of IBIS-gIBIS-style records, though this recording method does not center around it.

<Graph Breakdown Model> is a particularly useful type of <Model>, as a template that can be used to represent both artifacts and sets of concepts using a graph structure. Rather than enforcing a hierarchical breakdown on the individual parts of an artifact or set of related concepts, this component allows one to make arbitrary, overlapping associations among these parts, something that is particularly useful in conjunction with the <Issue> component. Issues are driven by the content of the design work, and so may refer to any combination of other elements of the record—a <Graph Breakdown Model> is a way for the designer to show all the conceptual groupings, interrelationships and dependencies that come into play in an artifact without being constrained by a 'part-of' style decomposition.

<Sketch/Drawing Model> is a link that is used to connect actual drawings and other visual data with <Model>, augmented by the components <Name Tag> and <Focusing Frame>.

<Timeline> is a place to put chronological data, showing when the designer's focus was on an issue or a model.

Figure 4:
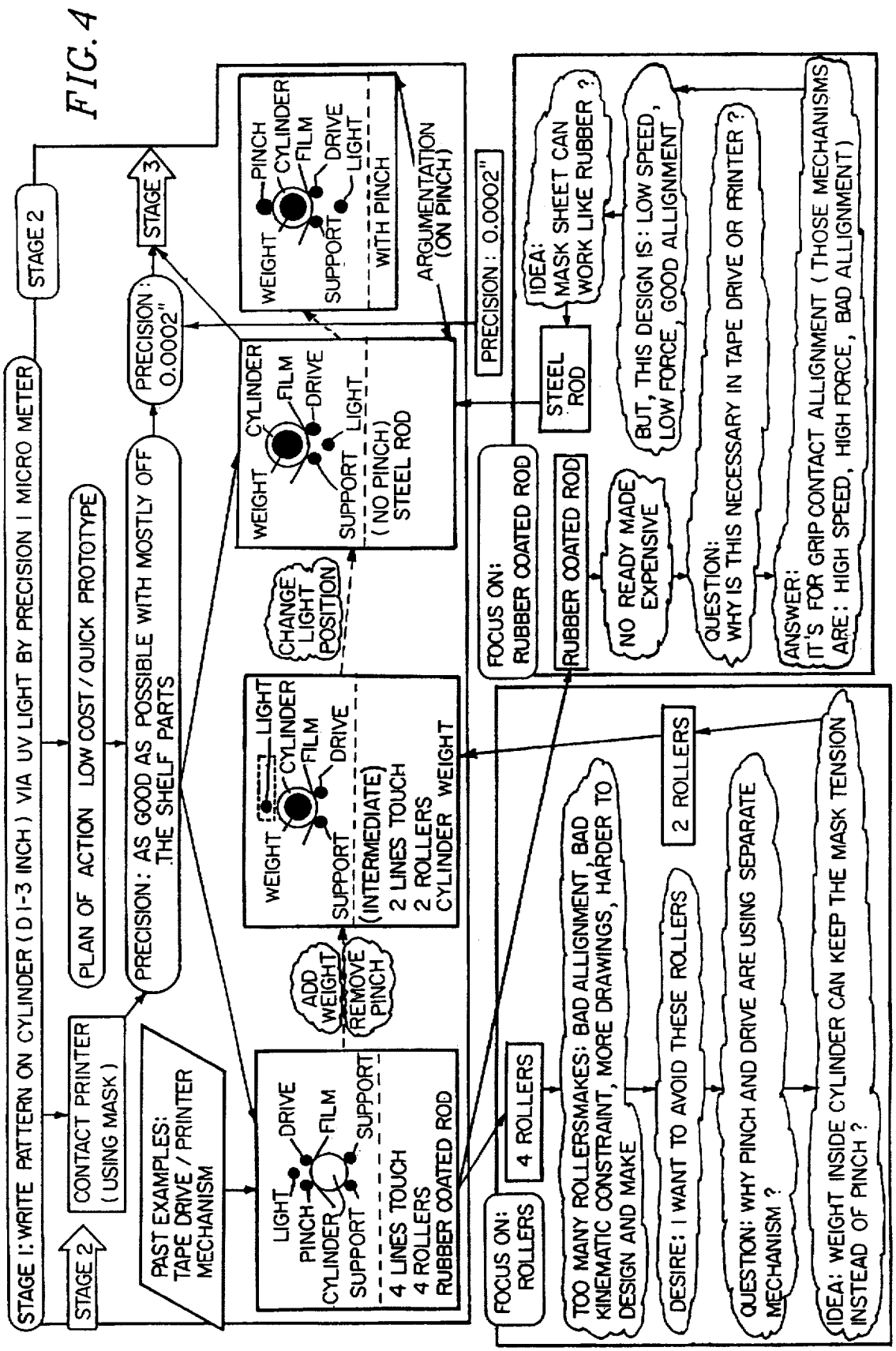
FIG. 4 is a diagram showing an arrangement of components of the design record.

FIG. 4 shows an excerpt from the design record for the mask-printer. In FIG. 4, there are copies of a few of the sketches from the example mask-printer's design notes, redrawn here for clarity, with an associated part of the mask-printer design record graphically represented around them. The <Stage>, <Model>, <Focus-On>, <Commentary>, <Reference>, etc. components connected to each other are arranged to show the design process. This is the form of record used by the DPR 1, and indicates the method of input we use: the designer uses a graph editor to place components on a screen, enter text or sketches into the components, make references to or include excerpts from working documents, and create directed or undirected links among them as appropriate.

In the record shown in FIG. 4, each component's type is indicated by its shape or a combination of shape and label: a rectangle is a <Model>, a rectangle with rounded corners is a <Requirement>, or is a <Stage> or <Focus-On> if so labeled; a cloud is <Commentary>, a parallelogram is <Reference>, etc., for example. The whole record from the mask-printer project, in addition to the working documents mentioned earlier, consisted of about 215 node-like elements and roughly three times as many links.

The Data Storage and Management Unit 3

Figure 5:
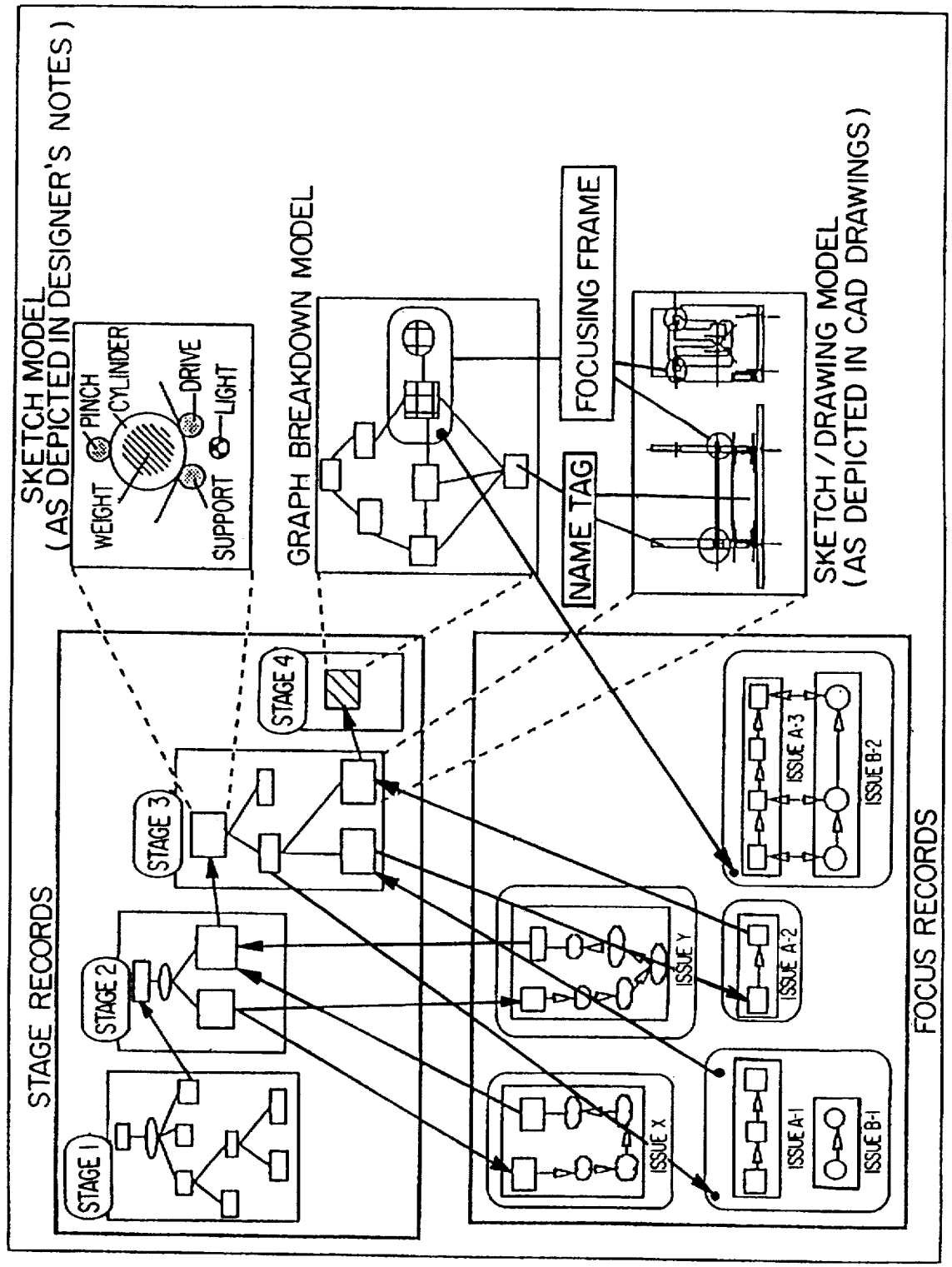
FIG. 5 is a diagram showing storage and management of the design history for the design process recorder.

The data storage and management unit of the design history for the DPR 1 is done by the data storage and management unit 3 in several linked parts, as shown in FIG. 5.

FIG. 5 shows the parts into which the DPR record is divided, and gives examples of their content.

The DPR record consists of:

A store called the Stage Record, containing linked <Requirement>, <Model>, <Reference>, <Commentary>, <Graph Breakdown Model> etc. components, grouped and organized using several <Next Stage> components by the designer to reflect a designer's-eye view of the overall process;

A store called the Focus Record, containing linked <Issue>, <Model>, and <Commentary> components, collected under <Focus On> components and linked by these back to the Stage Record; and A store of working documents generated by the designer in direct support of the project, e.g. such model representations as sketches, drawings, calculations, and other notes and documents, with overlaid <Focusing Frame>s and <Name Tag>s and links between these components and associated components of the Stage and Focus records.

The overall framework of the DPR's storage of the design record we call a hypergraph: 'graph' because of its node-arc structure, and 'hyper' because it spans several stores and types of information, from abstract labels to textual descriptions to CAD drawings to notebook sketches.

The Story Teller 4

The story teller 4 plays back design information in response to a query. The 'Story Teller' is named such because it is based on the idea that an effective way to convey a design rationale, and one which fits the data storage method of the DPR 1, is to present pieces of the record as a series of related design episodes, allowing those seeing this series to fill in any gaps based on their knowledge of the subject area. A possible scenario for the operation of this Story Teller is as follows:

An interested person with the appropriate background (the 'inquirer') browses through the design record's store of drawings and indicates to the system a part that is labeled with a <Name Tag> or demarcated by a <Focus Frame> that he/she would like to understand better.

The DPR 1 scans through the hypergraph, collecting all the information that appears to be associated with the indicated item. Association is determined beginning with any <Issue> component of the record that is connected with the <Focusing Frame> or associated <Name Tag>, expanding to include any alternatives in the Stage Record that are connected with the same <Issue> and any other components and working documents that are also connected directly with that <Issue> or with the other parts in the <Graph Breakdown Model>.

The DPR 1 presents the related information in the (usually chronological) order it is linked together in the design record, as a series of episodes of model evolution, settled or changed decisions, etc. It makes what is contained in the related <Requirement>, <Commentary>, <Focus On>, etc. components available in a series of screens that can be scanned back and forth at will by the inquirer.

Figure 6A:
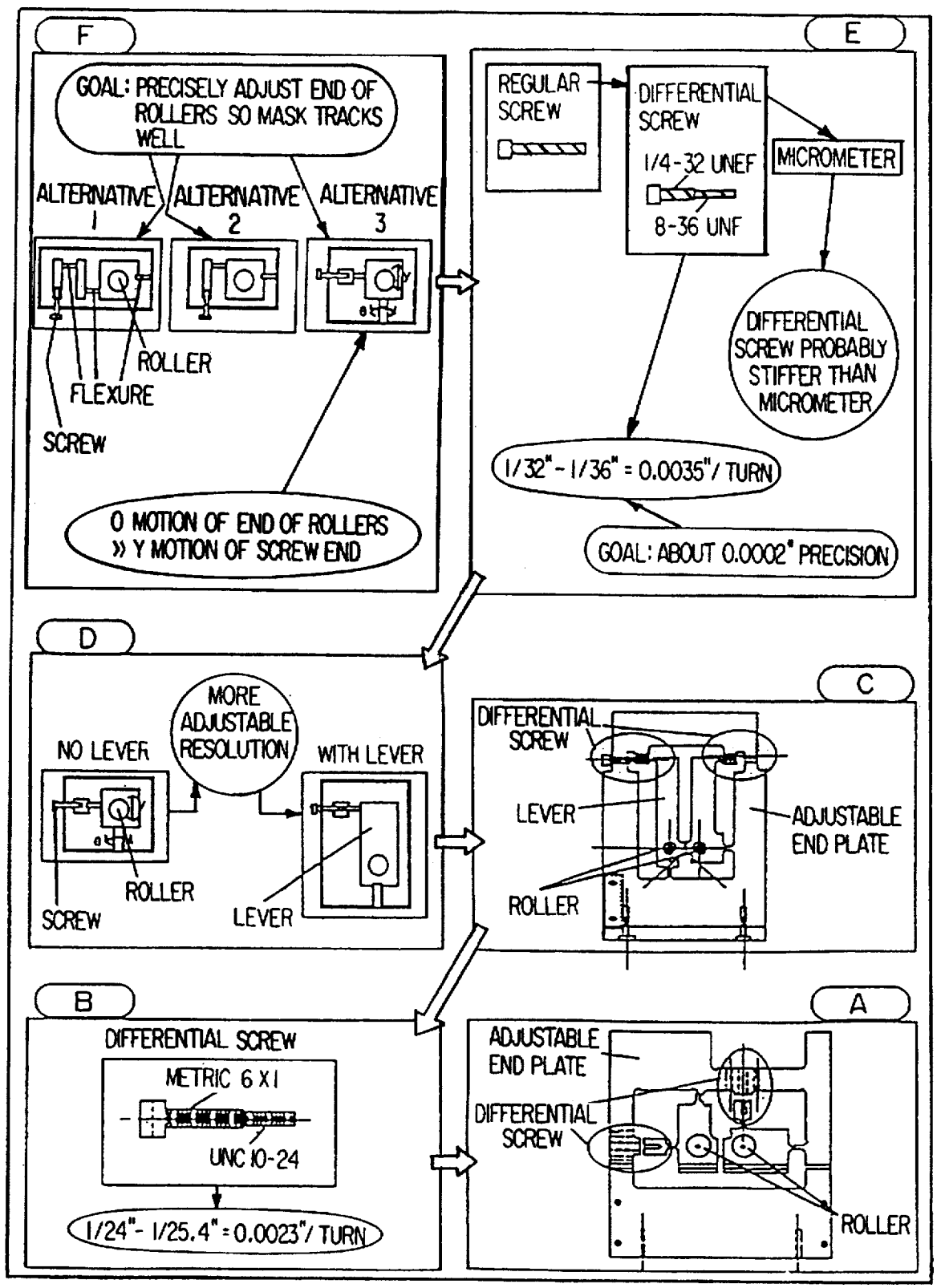
FIG. 6A is a diagram showing a presentation of an example of design information as a storyboard.

For example, referring back to the record excerpt represented in FIG. 5, if the inquirer were to indicate an interest in the area of the machine drawing indicated by the Focusing Frame label, he/she would be presented with a series like that in FIG. 6A, which are selected components of the record.

FIG. 6A shows an example of a presentation by the story teller 4. In response to a query about the machine drawing in the lower right, the story teller 4 traces back and forth trough the design record to find related information, then presents this information as a story-board in reverse order (F-A) in which it was found. In this example, labels on the drawings are <Name Tag> components; areas of pictures are each delimited by <Focusing Frame> (see, also FIG. 6B).

Figure 6B:
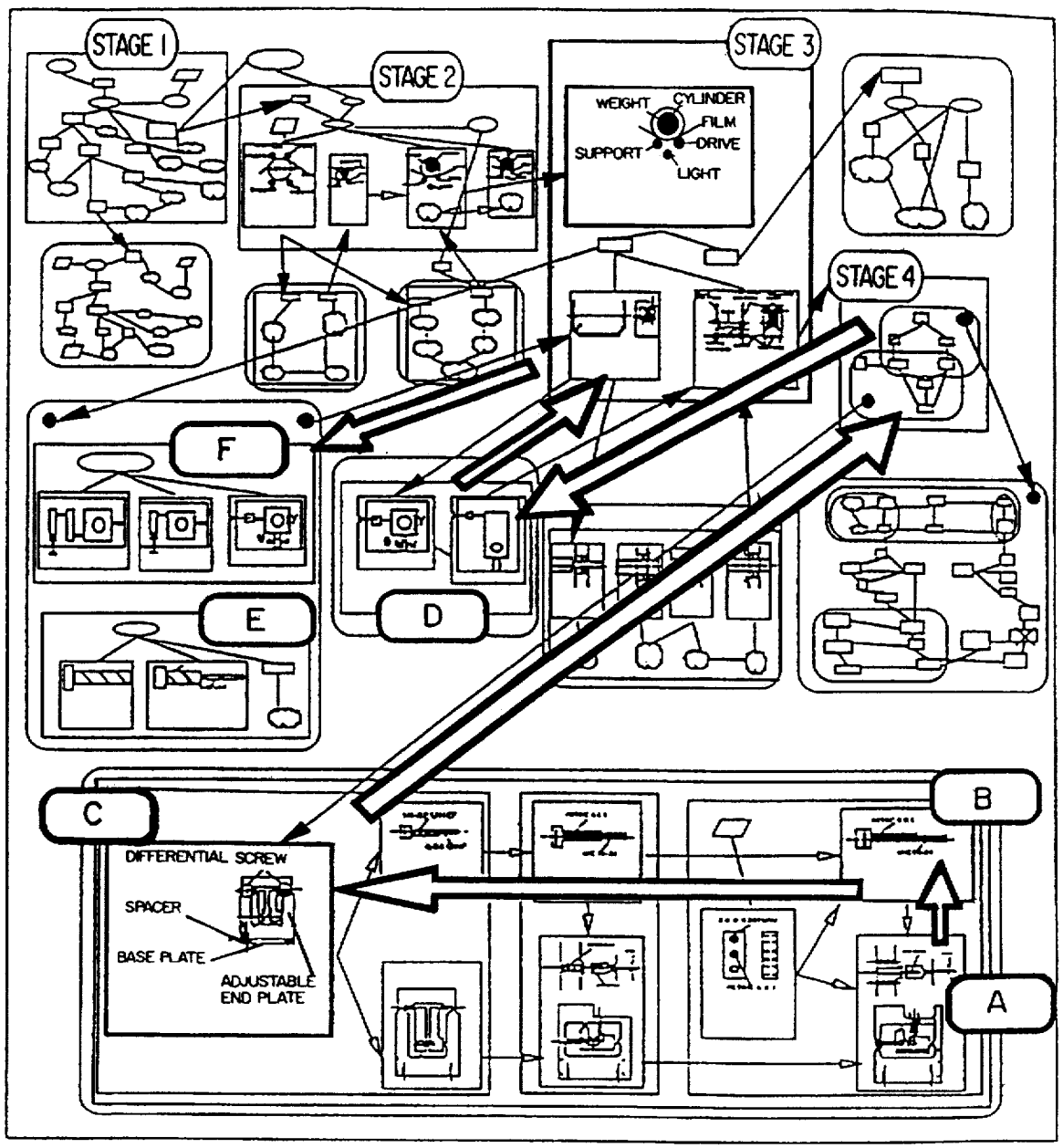
FIG. 6B is a diagram showing an example of the generation of a storyboard.

FIG. 6B shows a high-level view of the whole mask-printer record, with much of the detail removed, showing how selected connections are traced back to gather this information. In response to a query about part of the drawings labeled 'A', the story teller 4 traces back through the record via the indicated route, selecting parts of the record labeled 'B' through 'F', and then presenting these in reverse order, as the storyboard shown in FIG. 6A.

The resulting storyboard and several other scenario records were presented to several people with a technical background, with only an explanation of the purpose of the design work, and no specific commentary. Judging from the explanations they gave of the diagrams they were presented, we are confident they were able to make sense of notes in the context of the series of connected episodes, while they were much less able to make sense of the same notes individually.

The DPR 1 can be implemented by hardware and/or software. For example, the DPR 1 is implemented by a computer including a central processing unit (CPU), an input device, a memory and a display device. Programs for the data collector 2, the data storage and management unit 3 and the story teller 4 are prepared and stored in the memory. A query is input to the CPU via the input device. The CPU controls the execution of the programs. The result of the execution of the programs by the CPU is displayed on a screen by the display device. Thus, a storyboard visually showing a design process is displayed on the screen in response to a query.

FIG. 7 shows a configuration for the DPR 1 in more detail. The data storage and management 3 includes a document database 31, a document management unit 32 and a correlation unit 33.

The document database 31 stores design information. For example, the design information consists of documents which typically include text data. Such documents also may include sketches, calculation memos, comments, photographs and video data.

The document management unit 32 stores management information including a plurality of nodes, a plurality of arcs each connecting a pair of the nodes and a plurality of subgraphnodes each grouping the nodes and the arcs. A subgraphnode is connectable with a node grouped in another subgraphnode through an arc. A node grouped in a subgraphnode is also connectable with a node grouped in another subgraphnode through an arc. A subgraphnode may be connectable with another subgraphnode through an arc.

The correlation unit 33 correlates a node stored in the document management unit 32 to the design information stored in the document database 31. The correlation unit 33 may correlate the node to a specified portion of the design information. When the design information includes text data, a part of the text data can be specified by a page, a paragraph, a line, and a word, for example. When the design information includes a static picture or a moving picture, an area corresponding to the picture can be specified by an identifier or a label of the area, for example. When the design information includes image data including pixels each represented by 0 or 1, an area corresponding to the image data can be specified by lines or curves surrounding the area.

Figure 8:
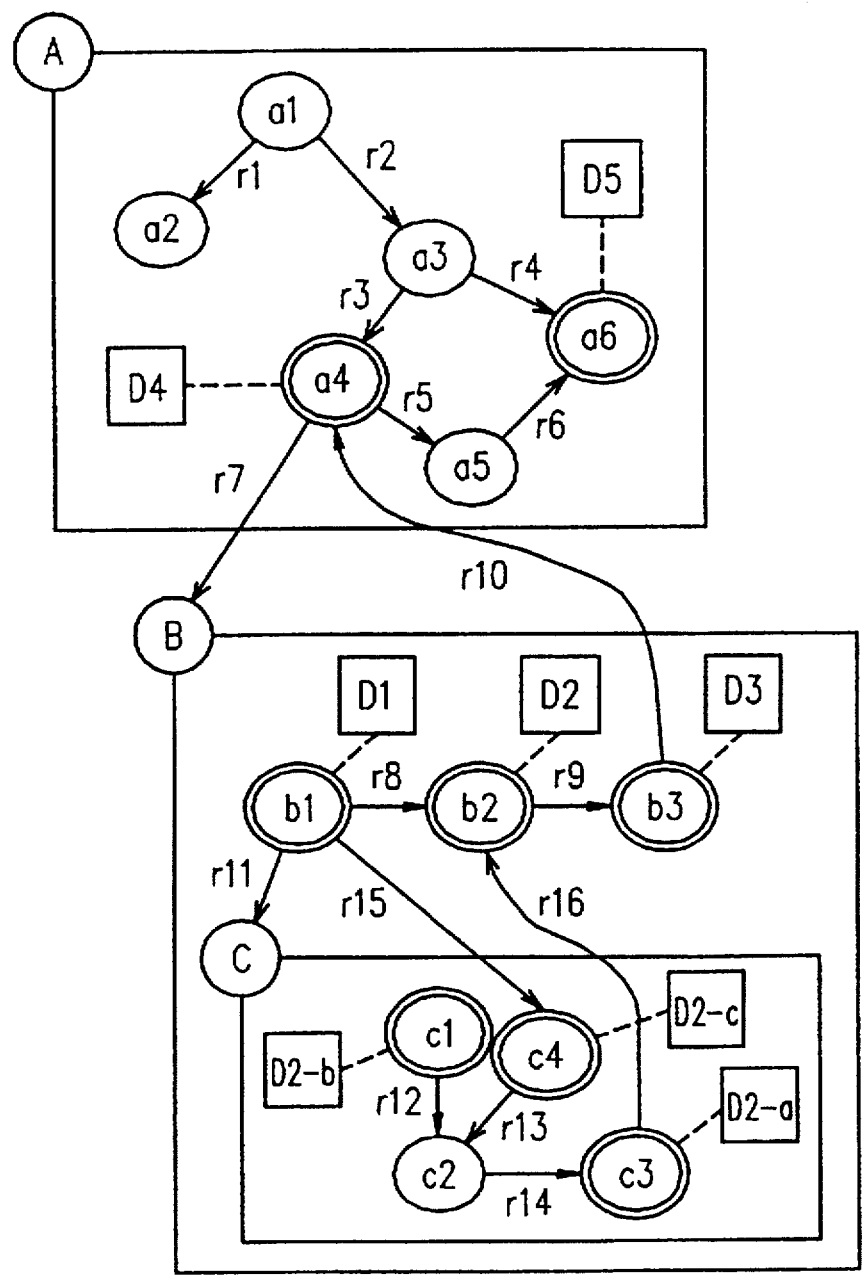
FIG. 8 is a diagram showing an example of the 'hypergraph' structure of the management information.

FIG. 8 shows an example of the 'hypergraph' structure of the management information stored in the document management unit 32. The management information includes subgraphnodes A, B and C. Subgraphnode A groups nodes a1 to a6 which connect with each other through arcs r1 to r6. In subgraphnode A, nodes a4 and a6 correspond to documents D4 and D5 stored in the document database 31, respectively.

Arc r7 is used to connect node a4 to subgraphnode B. Subgraphnode B groups nodes b1 to b3 which connect with each other through arcs r8 and r9. Arc r10 is used to connect node b3 to node a4. In subgraphnode B, nodes b1 to b3 correspond to documents D1, D2 and D3 stored in the document database 31, respectively.

Arc r11 is used to connect node b1 to subgraphnode C. Subgraphnode C groups nodes c1 to c4 which connect with each other through arcs r12 to r14. Arc r15 is used to connect node b1 to node c4. Arc r16 is used to connect node C3 to node b2. In subgraphnode C, nodes c1, c3 and c4 correspond to documents D2-b, D2-a and D2-c stored in the document database 31, respectively.

A node corresponding to a document is referred to as "document node", and the node is represented by a double circle in FIG. 8. A node not corresponding to any document is referred to as "relation node", and the node is represented by a single circle in FIG. 8.

Each subgraphnode includes a starting node indicating a source of the subgraphnode. In a retrieval, the starting node is treated as if it were the same as the subgraphnode. For example, it is assumed that node b1 is a starting node of subgraphnode B. In a retrieval, if the trace reaches node b1, then the trace jumps from node b1 to node a4 via subgraphnode B. Such jump occurs between the subgraphnodes.

Each node may have attribute data. The attribute data of node includes a kind of node, a title/explanation of node such as a document identifier, and a keyword which is used in a retrieval. The kind of node includes <Requirement>, <Model>, <Reference>, <Commentary>, <Plan-of Action>, <Focus-On>, <Stage>, etc. The keyword includes related specification, title and date, for example.

Each arc may have attribute data. The attribute data of an arc includes the direction of arc and the kind of arc. The kind of arc includes <alternative> (<alt>), <action>, <constraint>, etc.

Figure 9:
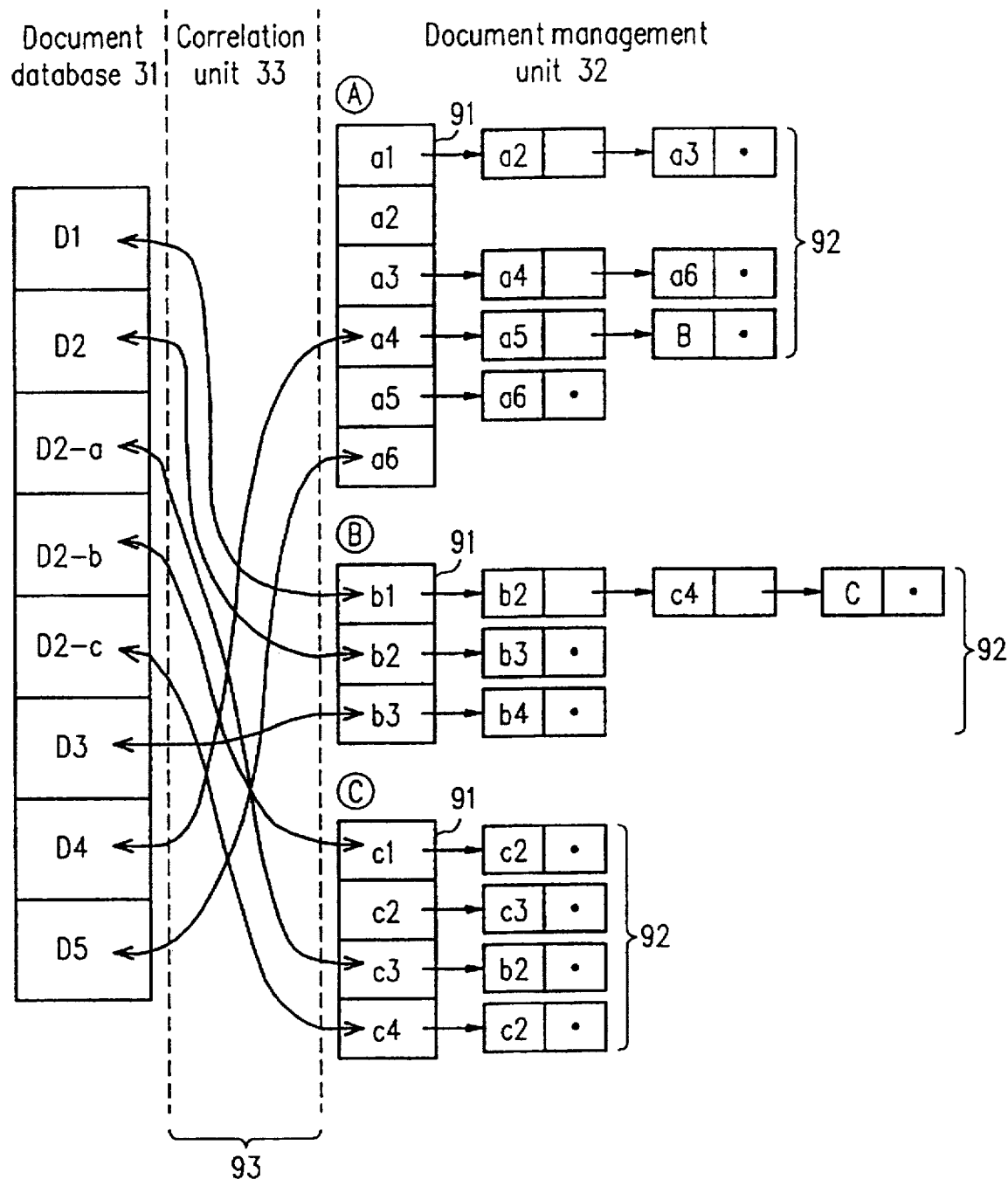
FIG. 9 is a diagram showing an example of the implementation of the 'hypergraph' structure of the management information.

FIG. 9 shows an example of the implementation of the 'hypergraph' structure of the management information shown in FIG. 8. The document database 31 stores documents D1, D2, D2-a, D2-b, D2-c, D3, D4 and D5. Nodes a1 to a6, b1 to b3 and c1 to c4, and arcs r1 to r15 are implemented by node lists 91 and a series of cells 92, as shown in FIG. 9. The structure of the nodes and the arcs are maintained by the document management unit 32. The correlation between the documents and the nodes are implemented by address links 93, as shown in FIG. 9. The correlations are maintained by the correlation unit 33.

Referring back to FIG. 7, the story teller 4 includes a trace unit 41 and a presentation unit 42.

The trace unit 41 traces back and forth nodes and arcs included in the management information stored in the document management unit 32 to find related design information in response to a query. Basically, a trace of nodes and arcs is made by the trace unit 41 in a reverse direction of arc, beginning with an indicated node. When a plurality of arcs flows in a node, the trace from the node is made for respective arcs, individually. However, such traces may be made under several constraints. For example, the trace is terminated, when the trace reaches a predetermined kind of node. Alternatively, the direction of the trace may change from a reverse direction to a forward direction and then the trace in the forward direction through a predetermined kind of untraced arc is performed, when the trace reaches a predetermined kind of node. The direction of the trace may change from the forward direction to the reverse direction, when the trace in the forward direction is terminated.

The presentation unit 42 presents the related design information in reverse order in which the related design information has been traced by the trace unit 41, when the related design information has been traced and collected in a reverse direction. The presentation unit 42 presents the related design information in forward order in which the related design information has been traced by the trace unit 41, when the related design information has been traced and collected in a forward direction. Such presentation is like a storyboard and therefore is helpful to remind a person of a specified design process. The related design information includes the attribute data of the node and the arc which have been traced by the trace unit 41 and the document corresponding to a document node which has been traced by the trace unit 41. The presentation unit 42 may present the related design information in a series of screens that can be scanned back and forth at will by the inquirer. Alternatively, the presentation unit 42 may display a traced path on a display screen in a different way. For example, a path traced by the trace unit 41 is distinguished from untraced paths in color or gray scales.

Hereinafter, examples of the generation of a storyboard by the story teller 4 will be described.

Figure 10A:
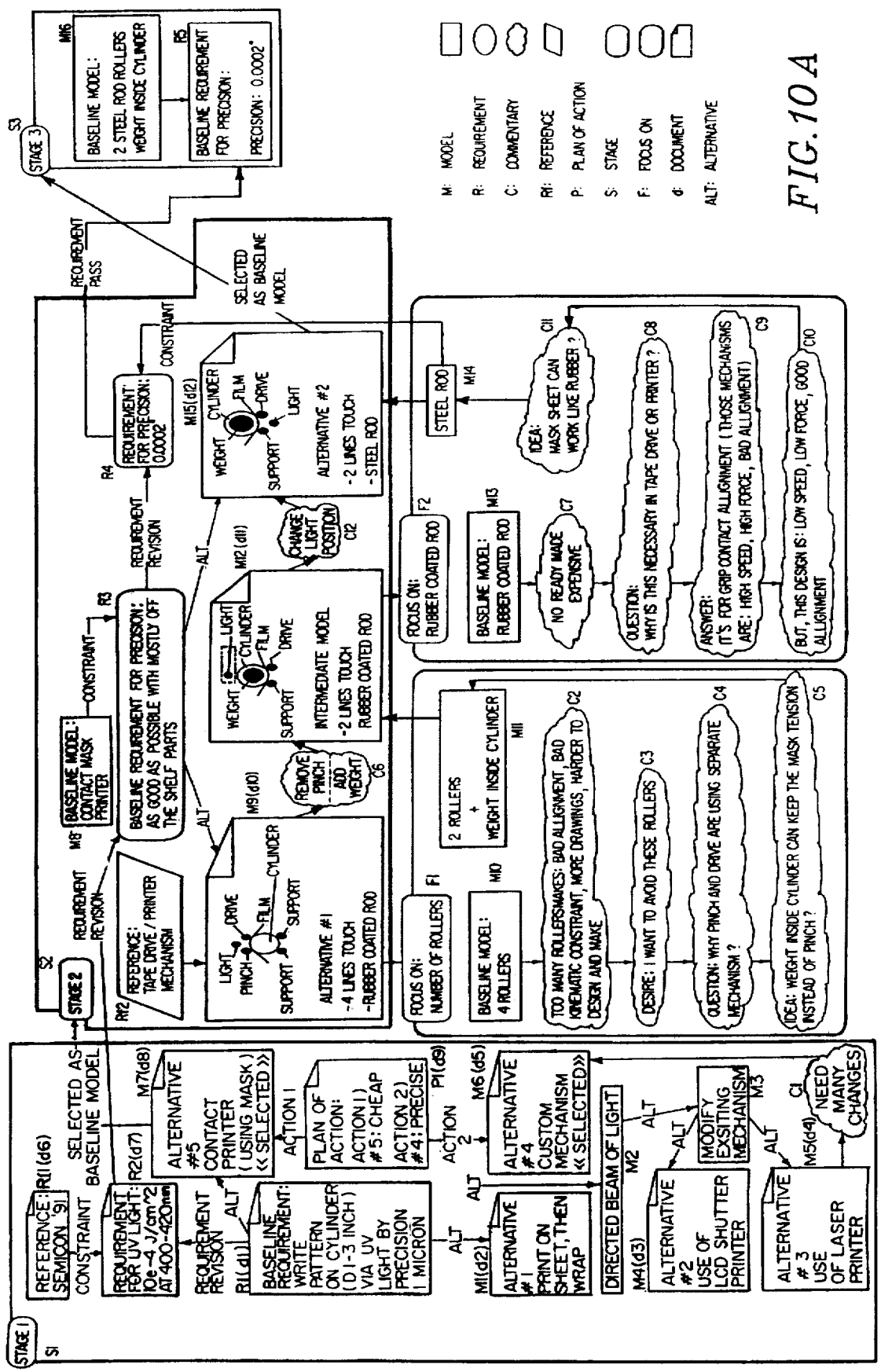
FIG. 10A is a diagram showing an example of the design record for a mask-printer.

FIG. 10A shows an example of design record for a mask-printer. The design record includes subgraphnodes S1(Stage 1), S2(Stage 2), S3(Stage 3), F1(Focus On:Number of Rollers) and F2(Focus On:Rubber Coated Rod).

Figure 10B:
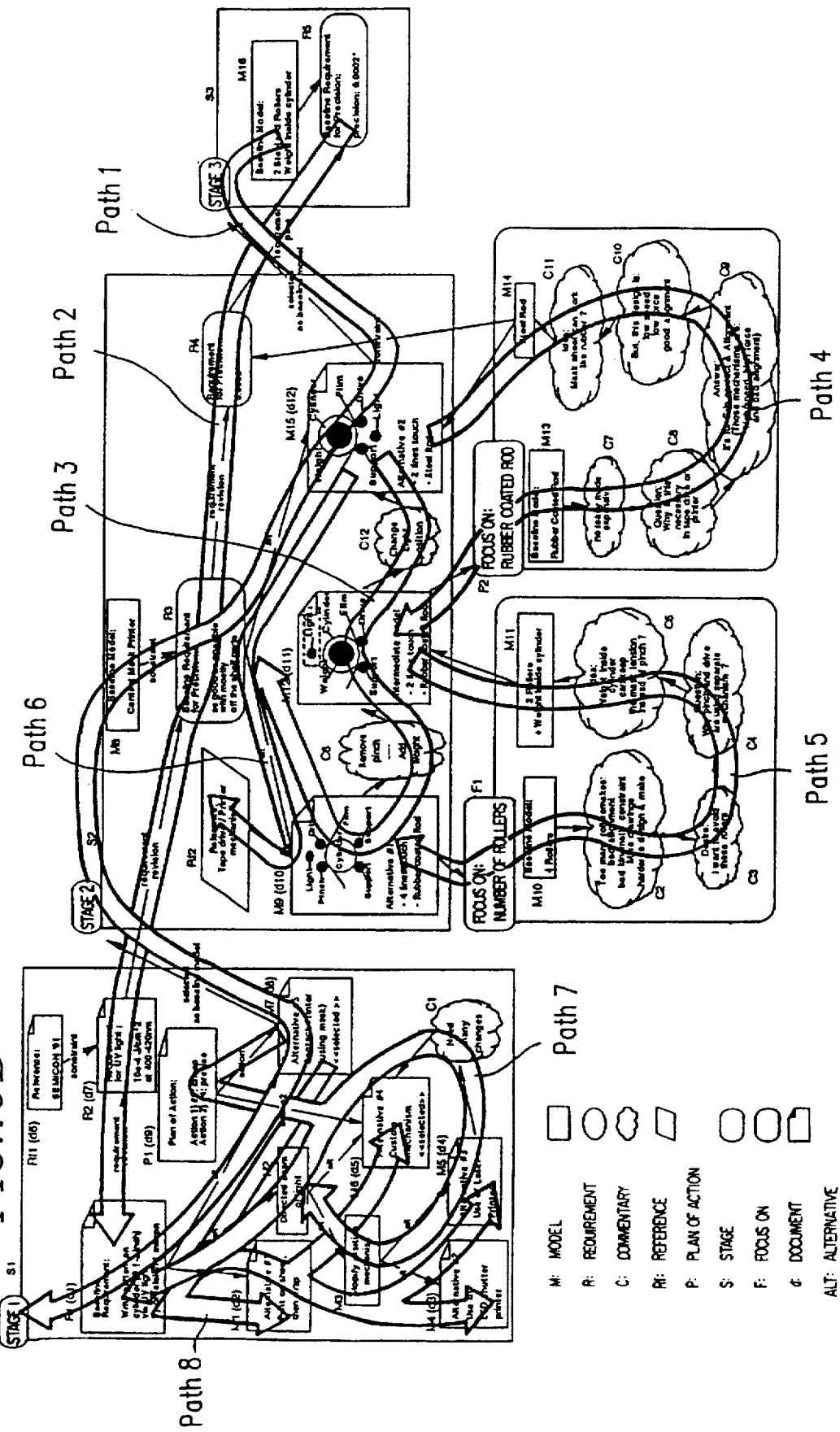
FIG. 10B is a diagram showing examples of paths traced by the trace unit 41 under various specific constraints.

FIG. 10B shows examples of paths traced by trace unit 41 under various specific constraints.

Path 1

Path 1 is traced under the following constraints:

(1) With respect to nodes, The state of <Requirement> node and <Model> node are set in TRACE-ON, while the state of the other kinds of nodes are set in TRACE-OFF;

(2) With respect to arcs, the state of <requirement revision> arc and <requirement pass> arc are set in TRACE-OFF, while the state of the other kinds of arcs are set in TRACE-ON; and (3) Node M16 is indicated in response to a query.

These constraints are typically used to clarify a main story of the whole design process. The trace unit 41 traces back and forth through nodes and arcs whose state are set in TRACE-ON, starting from the indicated node M16. The trace by the trace unit 41 jumps from node M16 (Baseline Model) to node S3 (Stage 3), because node M16 is a starting node in subgraphnode S3. Similarly, the trace jumps from node M8 (Baseline Model) to node S2 (Stage 2), and jumps from node R1 (Baseline Requirement) to node S1 (Stage 1).

Figure 11:
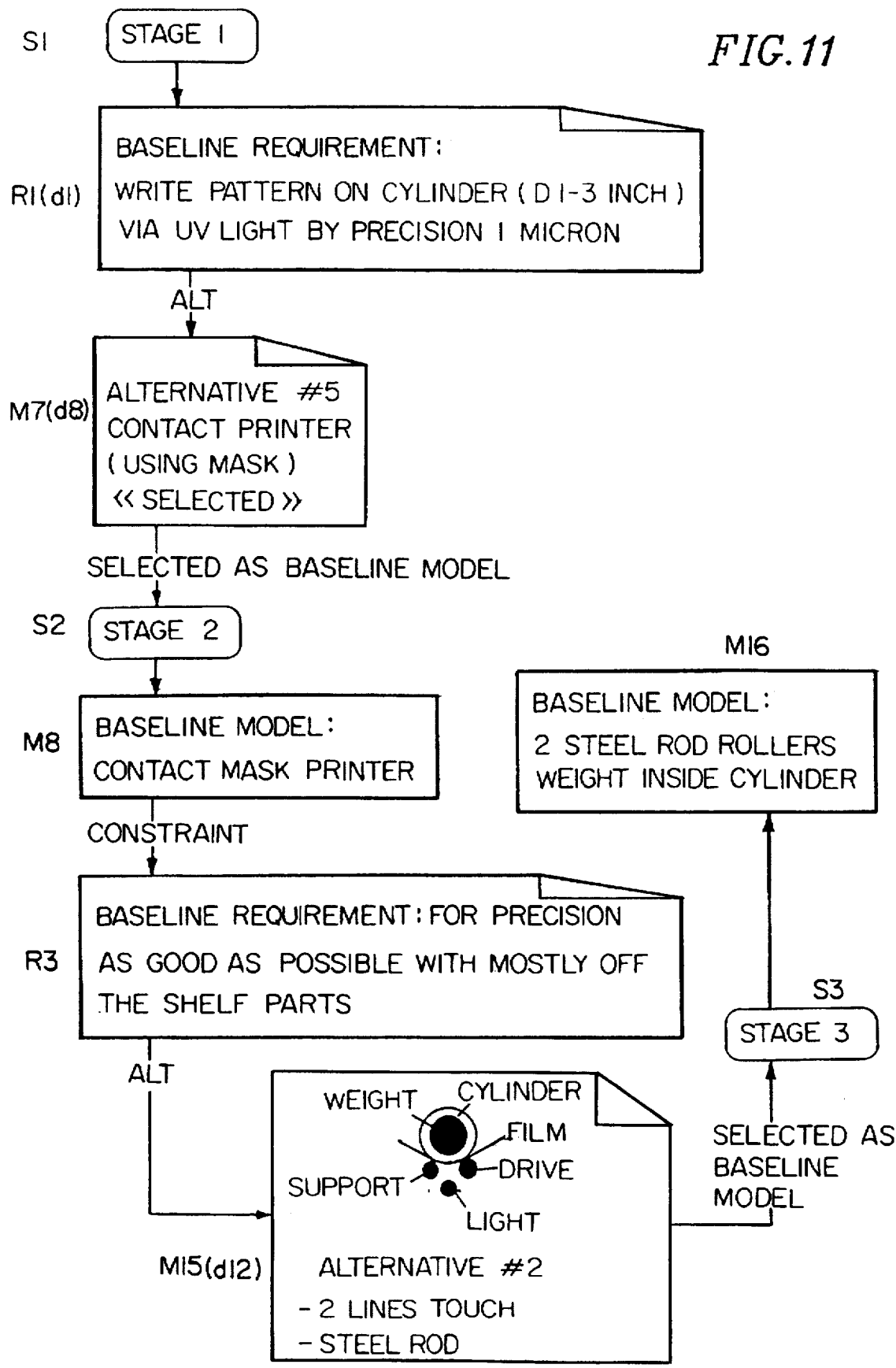

FIG. 11 shows an example of a storyboard presented by the presentation unit 42, when the trace unit 41 traces nodes and arcs along path 1 shown in FIG. 10B.

Path 2

Path 2 is traced under the following constraints:

(1) With respect to nodes, the state of <Requirement> node and a node connected to <Requirement> node via <constraint> arc are set in TRACE-ON, while the state of the other kinds of nodes are set in TRACE-OFF;

(2) With respect to arcs, the state of <requirement revision> arc, <requirement pass> arc and <constraint> arc connected with <Requirement> node are set in TRACE-ON, while the state of the other kinds of arcs are set in TRACE-OFF;

(3) Node R5 is indicated in response to a query.

These constraints are typically used to clarify the history of the changes and modifications of the requirements in the whole design process. The trace unit 41 traces back and forth through nodes and arcs whose state are set in TRACE-ON, starting from the indicated node R5.

Figure 12:
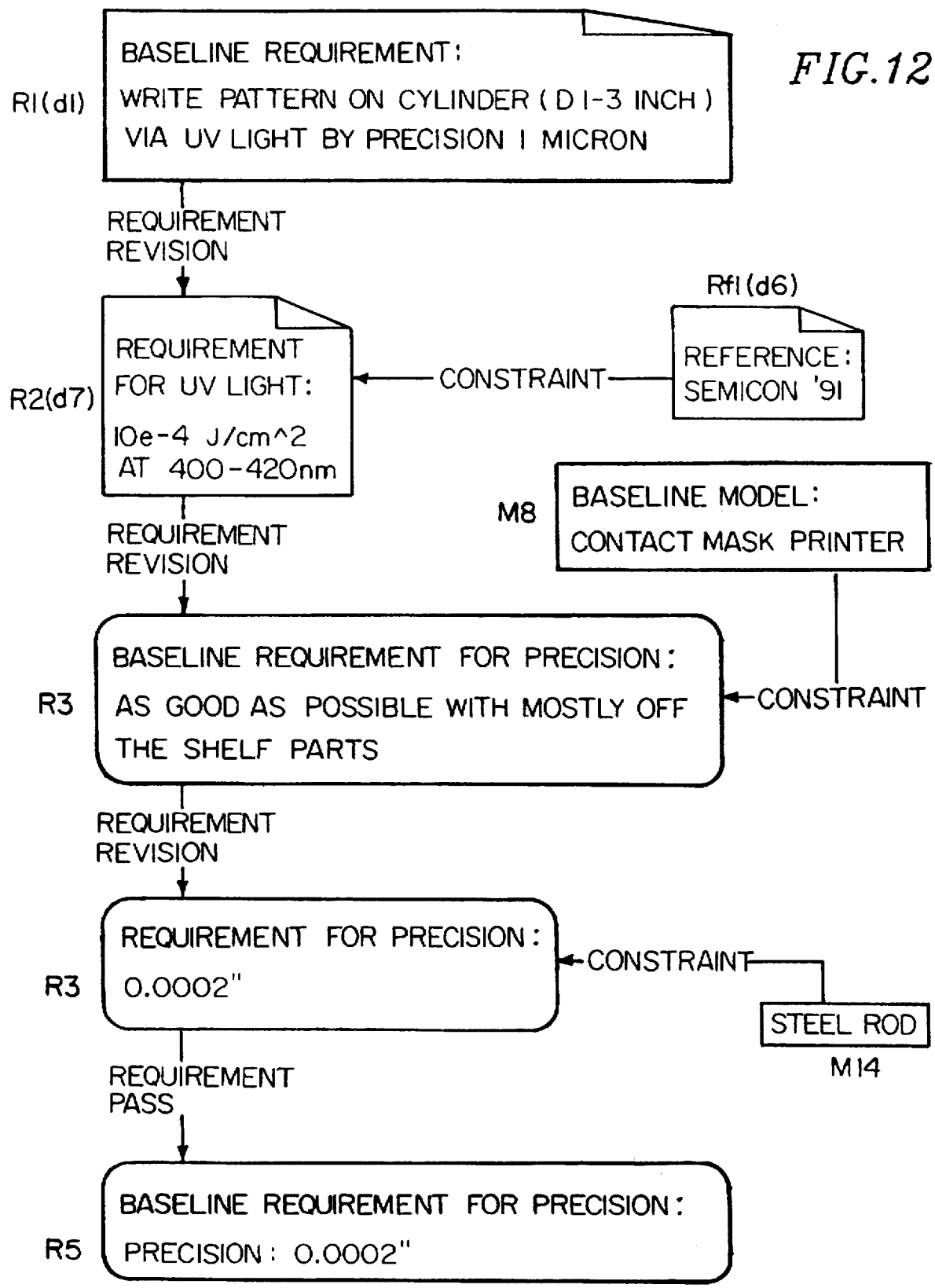

FIG. 12 shows an example of a storyboard presented by the presentation unit 42, when the trace unit 41 traces nodes and arcs along path 2 shown in FIG. 10B.

Path 3

Path 3 is traced under the following constraints:

(1) With respect to nodes, The state of <Requirement> node, <Model> node and <Commentary> node are set in TRACE-ON, while the state of the other kinds of nodes and the nodes on path 1 are set in TRACE-OFF;

(2) With respect to arcs, the state of <requirement revisions> arc and <requirement pass> arc are set in TRACE-OFF, while the state of the other kinds of arcs are set in TRACE-ON; and (3) Node M15 is indicated in response to a query.

These constraints are typically used to clarify detail episodes about the changes and modifications of the ideas in the design process. Nodes M9, M12 and M15 are document nodes, and correspond to documents d10, d11 and d12, respectively. The trace unit 41 traces back and forth through nodes and arcs whose state are set in TRACE-ON, starting from the indicated node M15.

FIG. 13 shows an example of a storyboard presented by the presentation unit 42, when the trace unit 41 traces nodes and arcs along path 3 shown in FIG. 10B. In FIG. 13, the design process from the Baseline Requirement (R3) to the Model (M15) is presented in more detail, compared with the design process shown in FIG. 11.

Path 4

Path 4 is traced under the following constraints:

(1) With respect to nodes, The state of <Requirement> node, <Model> node, <Commentary> node and <Focus on> node are set in TRACE-ON, while the state of the other kinds of nodes and the nodes on path 3 are set in TRACE-OFF;

(2) With respect to arcs, the state of <requirement revision> arc and <requirement pass> arc are set in TRACE-OFF, while the state of the other kinds of arcs are set in TRACE-ON; and (3) Node M15 is indicated in response to a query.

These constraints are typically used to clarify detail episodes about the changes and modifications of the ideas in the design process. Especially, when the ideas are focused on an issue, these constraints are effective. Nodes M12 and M15 are document nodes, and correspond to documents d11 and d12, respectively. The trace unit 41 traces back and forth through nodes and arcs whose state are set in TRACE-ON, starting from the indicated node M15. The trace by the trace unit 41 jumps from node M13 (Baseline Model) to node F2 (Focus on:Rubber Coated Rod), because node M13 is a starting node in subgraphnode F2.

Figure 14:
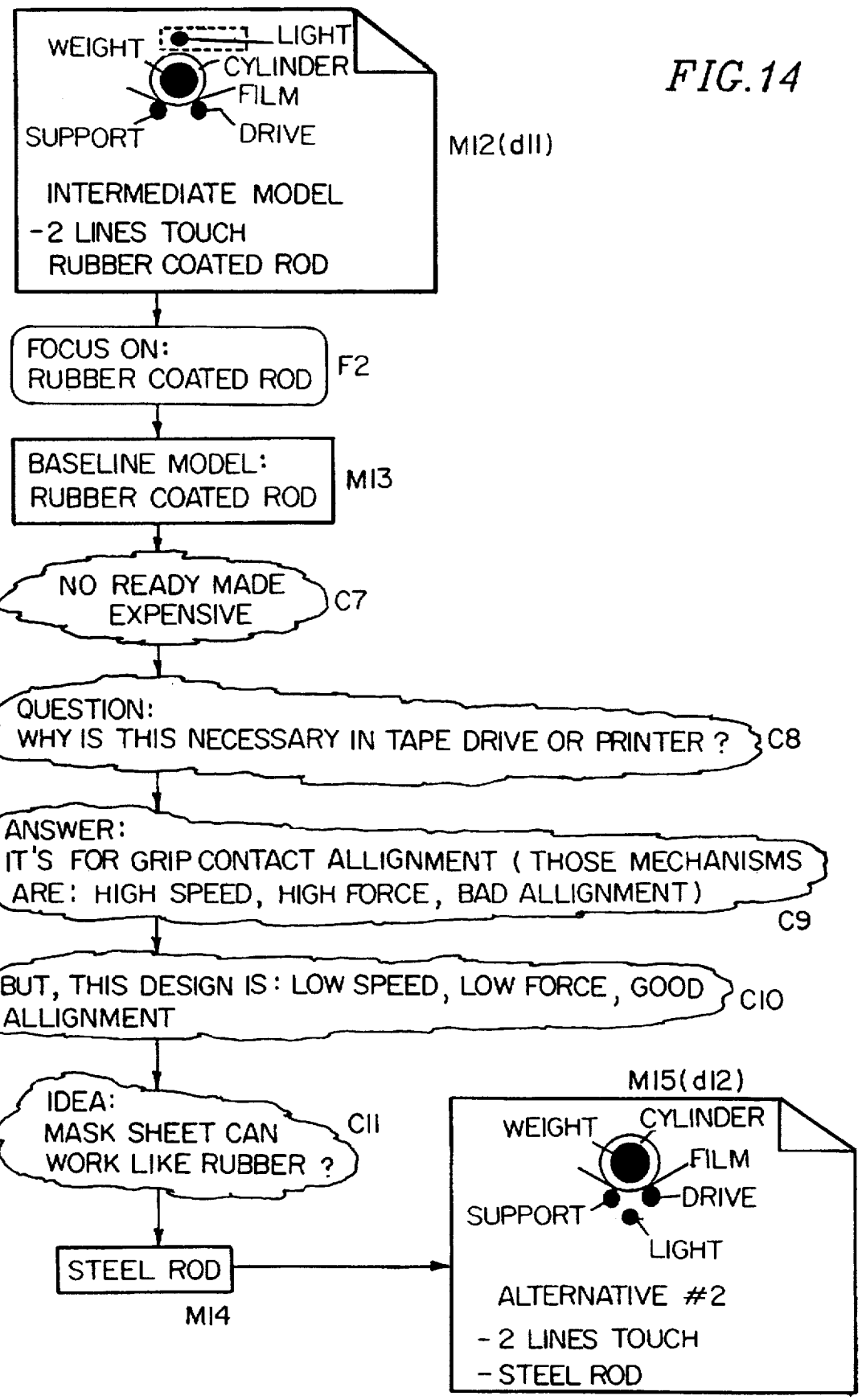

FIG. 14 shows an example of a storyboard presented by the presentation unit 42, when the trace unit 41 traces nodes and arcs along path 4 shown in FIG. 10B. In FIG. 14, the design process from the Model (M12) to the Model (M15) is presented in more detail, compared with the design process shown in FIG. 13.

Path 5

Path 5 is traced under the following constraints:

(1) With respect to nodes, The state of <Requirement> node, <Model> node, <Commentary> node and <Focus on> node are set in TRACE-ON, while the state of the other kinds of nodes and the nodes on path 3 are set in TRACE-OFF;

(2) With respect to arcs, the state of <requirement revision> arc and <requirement pass> arc are set in TRACE-OFF, while the state of the other kinds of arcs are set in TRACE-ON; and (3) Node M12 is indicated in response to a query.

These constraints are typically used to clarify detail episodes of the changes and modifications of the ideas in the design process. Especially, when the ideas are focused on an issue, these constraints are effective. Nodes M9 and M12 are document nodes, and correspond to documents d10 and d11, respectively. The trace unit 41 traces back and forth through nodes and arcs whose state are set in TRACE-ON,, starting from the indicated node M12. The trace by the trace unit 41 jumps from node M10 (Baseline Model) to node F1 (Focus on:Number of Rollers), because node M10 is a starting node in subgraphnode F1.

Figure 15:
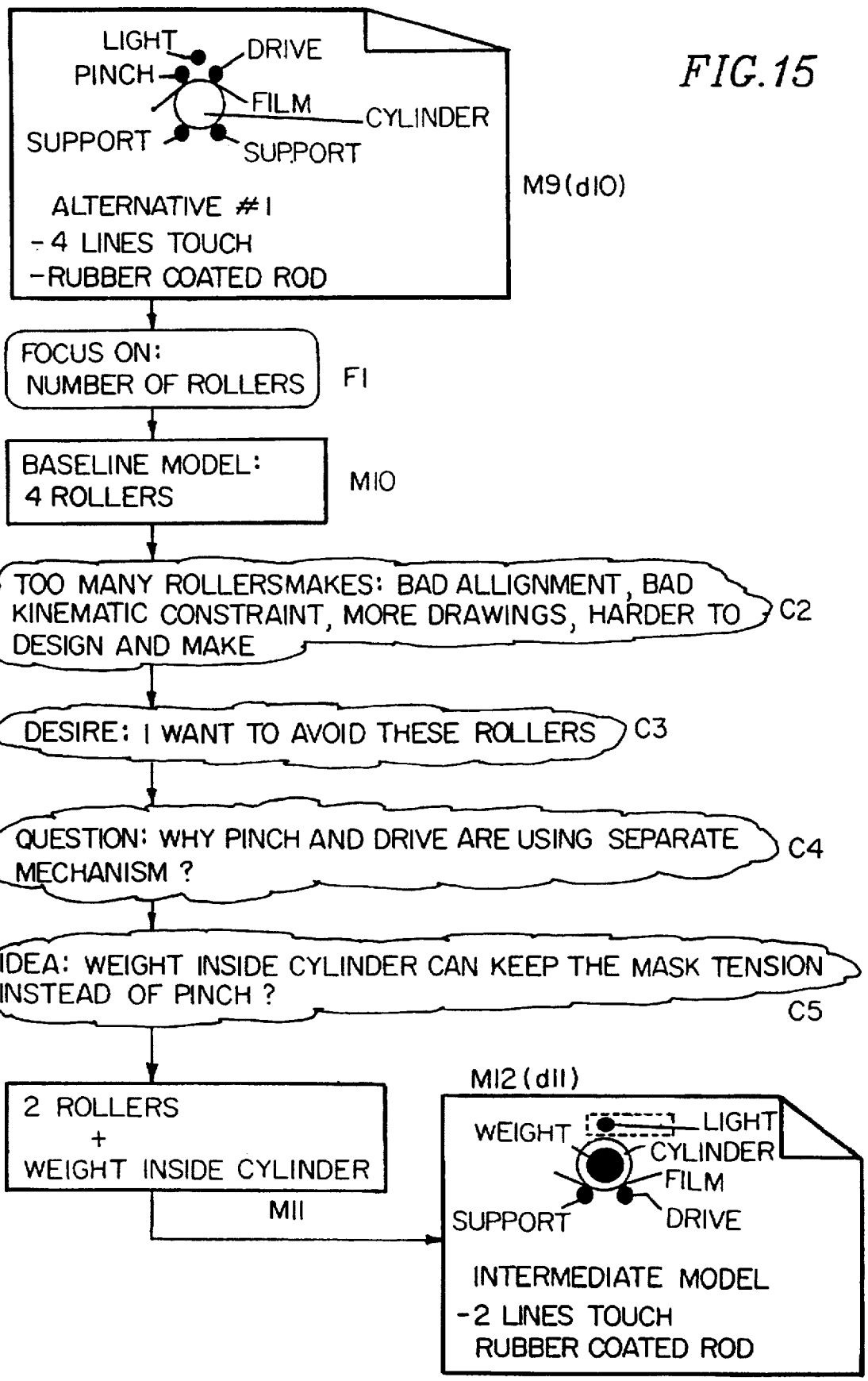

FIG. 15 shows an example of a storyboard presented by the presentation unit 42, when the trace unit 41 traces nodes and arcs along path 5 shown in FIG. 10B. In FIG. 15, the design process from the Model (M9) to the Model (M12) is presented in more detail, compared with the design process shown in FIG. 13.

Path 6

Path 6 is traced under the following constraints:

(1) With respect to nodes, the state of all kinds of nodes are set in TRACE-ON. When the trace reaches a <Requirement> node, an untraced <alt> arc which flows out from the <Requirement> node is traced in a forward direction;

(2) With respect to arcs, the state of all kinds of arcs are set in TRACE-ON; and (3) Node M15 is indicated in response to a query.

These constraints are typically used to clarify all alternative models corresponding to a specified requirement of the design process. Nodes M9 and M15 are document nodes, and correspond to documents d10 and d12, respectively. The trace unit 41 traces back and forth through nodes and arcs whose states are set in TRACE-ON, starting from the indicated node M15. When the trace by the trace unit 41 reaches node R3, the trace unit 41 traces an untraced <alt> arc in a forward direction to reach node M9 and then traces in a reverse direction.

FIG. 16 shows an example of a storyboard presented by the presentation unit 42, when the trace unit 41 traces nodes and arcs along path 6 shown in FIG. 10B. As shown in FIG. 16, the alternative models (M15 and M9) corresponding to the requirement (R3) are presented.

Path 7

Path 7 is traced under the following constraints:

(1) With respect to nodes, the state of all kinds of nodes are set in TRACE-ON. When the trace reaches a <Plan of Action> node, an untraced <action> arc which flows out from the <Plan of Action> node is traced in a forward direction;

(2) With respect to arcs, the states of all kinds of arcs are set in TRACE-ON; and (3) Node M7 is indicated in response to a query.

These constraints are typically used to clarify all alternative actions corresponding to a specified plan of action of the design process. Nodes R1, M5, M6, M7 and P1 are document nodes, and correspond to documents d1, d4, d5, d8 and d9, respectively. The trace unit 41 traces back and forth through nodes and arcs whose state are set in TRACE-ON, starting from the indicated node M7. When the trace by the trace unit 41 reaches node P1, the trace unit 41 traces an untraced <action2> arc in a forward direction to reach node M9 and then traces in a reverse direction.

Figure 17:
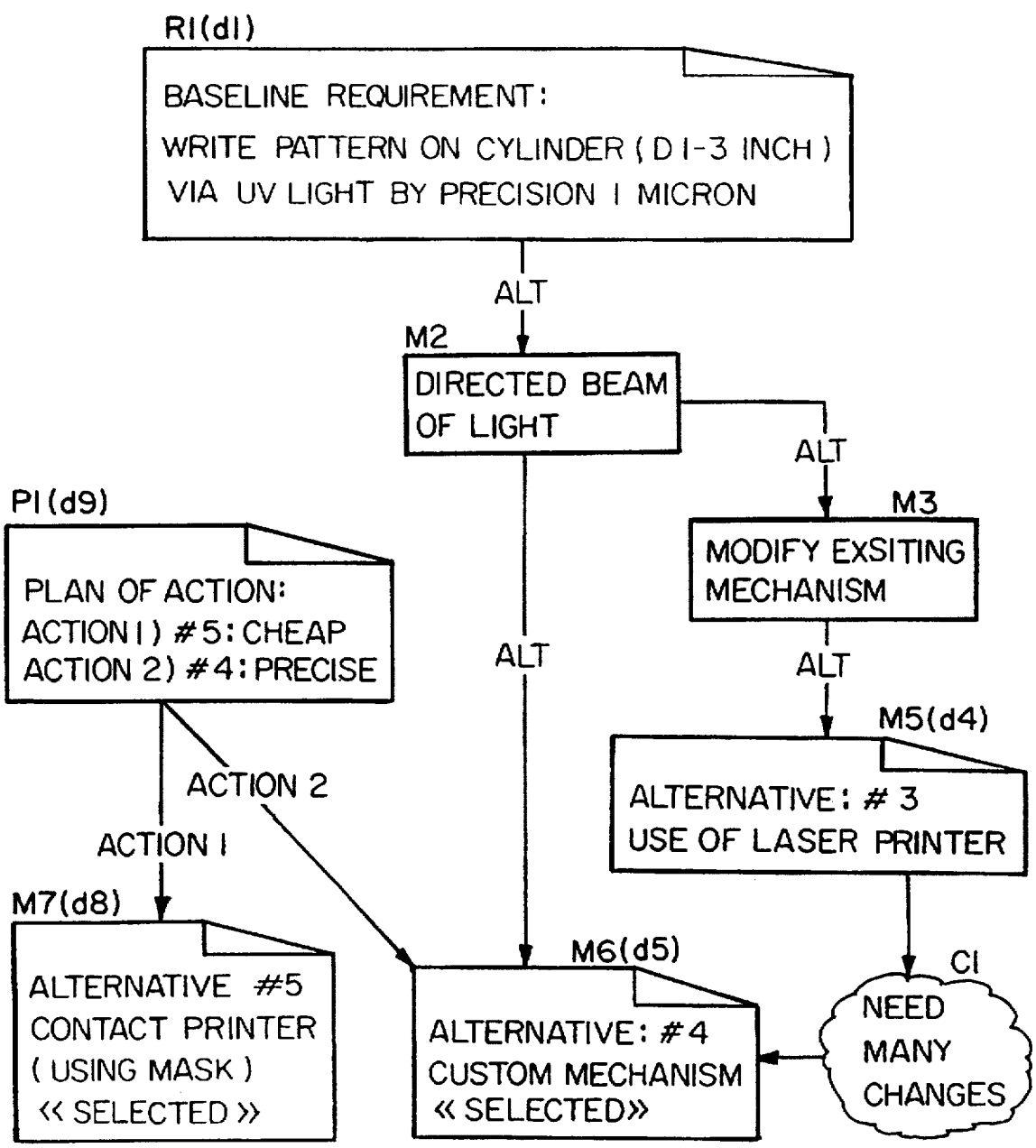

FIG. 17 shows an example of a storyboard presented by the presentation unit 42, when the trace unit 41 traces nodes and arcs along path 7 shown in FIG. 10B. As shown in FIG. 17, the alternative actions (M7 and M6) corresponding to the plan of action (P1) are presented.

Path 8

Path 8 is traced under the following constraints:

(1) With respect to nodes, the states of all kinds of nodes are set in TRACE-ON. When the trace reaches a <Requirement> node, an untraced <alt> arc which flows out from the <Requirement> node is traced in a forward direction;

(2) With respect to arcs, the state of all kinds of arcs are set in TRACE-ON; and (3) Node M7 is indicated in response to a query.

These constraints are typically used to clarify all alternative models corresponding to a specified requirement of the design process. Nodes R1, M1, M4, M5, M6 and M7 are document nodes, and correspond to documents d1, d2, d3, d4, d5 and d8, respectively. The trace unit 41 traces back and forth through nodes and arcs whose state are set in TRACE-ON, starting from the indicated node M7. When the trace by the trace unit 41 reaches node R1, the trace unit 41 traces untraced <alt> arcs in a forward direction.

Figure 18:
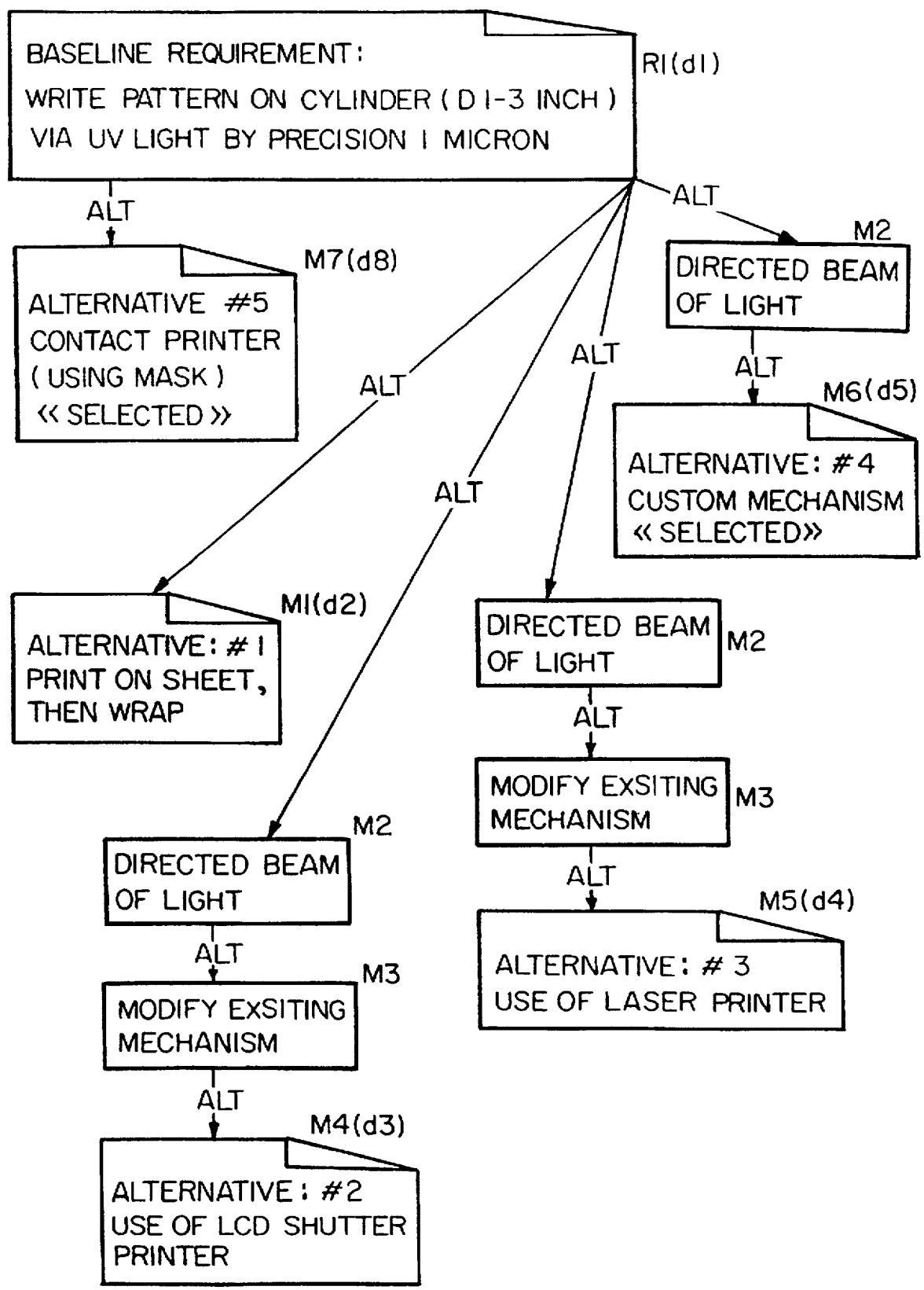

FIG. 18 shows an example of a storyboard presented by the presentation unit 42, when the trace unit 41 traces nodes and arcs along path 8 shown in FIG. 10B. As shown in FIG. 18, the alternative models (M7, M1, M4, M5 and M6) corresponding to the requirement (R1) are presented.

In the present specification, "design" is not limited to a hardware design like a mechanism design or an electronics design, a software design and a firmware design. In the present specification, the "design" includes any creative activity such as the plan of an idea, the conception of an idea, the improvement of an idea and the selection of an idea, which can be seen in various stages of various activities including business activities and personal daily activities. In addition, in the present specification, "document" includes a multimedia document.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A design process recorder comprising:

first storage means for storing information generated or acquired during a progress of design, wherein said information extends beyond the design itself and involves the evolution of the design;

second storage means for storing management information including a plurality of nodes and a plurality of arcs each connecting a pair of said nodes;

correlation means for correlating one of said plurality of nodes stored in said second storage means to at least a portion of said information stored in said first storage means;

input means for allowing a user to indicate a node where a design process playback will be started;

trace means for tracing back and forth said nodes and said arcs from said node indicated by said user; and presentation means for presenting said information correlated to nodes traced by said trace means in the order traced.

2. A design process recorder according to claim 1, wherein said trace means selectively traces back and forth said nodes and said arcs in accordance with a predetermined rule.

3. A design process recorder according to claim 1, further comprising:

edit means for editing said management information interactively.

4. A design process recorder as recited in claim 1, wherein the information includes at least one of documents with text data, sketches, calculation memos, comments, photographs and video data.

5. A design process recording method comprising the steps of:

a) storing information generated or acquired during a progress of design, wherein said information extends beyond the design itself and involves the evolution of the design;

b) storing management information including a plurality of nodes and a plurality of arcs each connecting a pair of said nodes;

c) correlating one of said plurality of nodes provided in said storing step b) to at least a portion of said information provided in storing step a);

d) indicating a node where a design process playback will be started;

e) tracing back and forth said nodes and said arcs provided in said storing step b) from said node indicated in said step d); and f) presenting said information correlated to nodes traced in said tracing step e) in the order traced.

6. A design process recording method according to claim 5, wherein step e) includes a step of selectively tracing back and forth said nodes and said arcs in accordance with a predetermined rule.

7. A design process recording method according to claim 5, further comprising a step of editing said management information interactively.

8. A design process recording method as recited in claim 5, wherein the information includes at least one of documents with text data, sketches, calculation memos, comments, photographs and video data.

* * * * *